(12) United States Patent
Lee et al.

(10) Patent No.: US 12,721,201 B2
(45) Date of Patent: Aug. 25, 2026

(54) CIRCUIT BOARD AND SEMICONDUCTOR PACKAGE HAVING THE SAME

(71) Applicant: LG INNOTEK CO., LTD., Seoul (KR)

(72) Inventors: Su Min Lee, Seoul (KR); Dae Young Ku, Seoul (KR); Ji Hoon Kim, Seoul (KR); Dae Sung Moon, Seoul (KR); Byung Wook Woo, Seoul (KR); Chang Woo Yoo, Seoul (KR); Sang Hyun Lee, Seoul (KR); Ju Hyun Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 267 days.

(21) Appl. No.: 18/606,069

(22) Filed: Mar. 15, 2024

(65) Prior Publication Data

US 2025/0218913 A1 Jul. 3, 2025

(30) Foreign Application Priority Data

Jan. 2, 2024 (KR) ........................ 10-2024-0000322

(51) Int. Cl.
*H10W 70/685* (2026.01)
*H05K 1/185* (2026.01)
(Continued)

(52) U.S. Cl.
CPC .......... *H10W 70/685* (2026.01); *H05K 1/185* (2013.01); *H05K 3/28* (2013.01); *H05K 3/4644* (2013.01); *H10W 70/05* (2026.01)

(58) Field of Classification Search
None
See application file for complete search history.

(56) References Cited

U.S. PATENT DOCUMENTS 5,523,622 A * 6/1996 Harada ................. H10W 70/68 257/734
5,684,677 A * 11/1997 Uchida .................. H05K 3/303 361/773
(Continued)

FOREIGN PATENT DOCUMENTS

JP 2010-118469 A 5/2010
KR 10-2011-0115780 A 10/2011
(Continued)

OTHER PUBLICATIONS

Original and Translation of KR 1996-0009092 (Year: 1996).*

*Primary Examiner* — Timothy J. Dole
*Assistant Examiner* — Muhammed Azam
(74) *Attorney, Agent, or Firm* — Birch, Stewart, Kolasch & Birch, LLP

(57) ABSTRACT

A circuit board includes a build-up structure including a plurality of insulating layers stacked along a vertical direction; a solder resist layer disposed on the build-up structure and including a through hole; and a plurality of insulating members disposed on the solder resist layer and spaced apart from each other along a horizontal direction, an electronic device disposed on the through holes of the solder resist layer and including a plurality of terminals, wherein the build-up structure includes a plurality of pads overlapping the through hole of the solder resist layer along the vertical direction, the electronic device overlaps the plurality of insulating members along the vertical direction, the plurality of pads are electrically connected to the plurality of terminals of the electronic device, respectively, the solder resist layer includes a plurality of overlapping regions overlapping the plurality of insulating members along the vertical direction, and the through hole of the solder resist layer is disposed between the plurality of overlapping regions.

20 Claims, 13 Drawing Sheets

(51) Int. Cl.
*H05K 3/28* (2006.01)
*H05K 3/46* (2006.01)
*H10W 70/05* (2026.01)

(56) References Cited

U.S. PATENT DOCUMENTS 6,329,610 B1* 12/2001 Takubo .................. H05K 3/462 174/255
6,486,549 B1* 11/2002 Chiang ................. H10W 90/00 257/E21.705
6,909,054 B2* 6/2005 Sakamoto ............. H10W 72/30 257/E23.178
7,309,916 B2* 12/2007 Kang .................... H10W 72/00 257/E23.079
7,321,164 B2* 1/2008 Hsu ..................... H10W 70/614 257/725
7,417,299 B2* 8/2008 Hu ...................... H10W 70/614 257/E23.101
7,507,915 B2* 3/2009 Chang .................... H05K 1/185 174/262
7,639,473 B2* 12/2009 Hsu ........................ H05K 1/185 361/312
7,791,204 B2* 9/2010 Hayashi .................. H10P 72/74 257/773
7,881,069 B2* 2/2011 Inagaki .................. H05K 1/181 361/764
7,944,039 B2* 5/2011 Arai ........................ H10P 72/74 257/784
8,314,495 B2* 11/2012 Hayashi .................. H10P 72/74 257/773
8,705,248 B2* 4/2014 Ito ........................ H05K 1/0218 361/795
8,872,041 B2* 10/2014 Lee ........................ H05K 1/186 174/250
8,927,417 B2* 1/2015 Yap ....................... H10W 74/01 438/668
9,147,587 B2* 9/2015 Lin ....................... H10W 20/40
9,253,887 B2* 2/2016 Wang .................. H10W 70/614
9,591,763 B2* 3/2017 Abe ....................... H05K 1/111
9,686,866 B2* 6/2017 Chang .................... H05K 1/186
9,883,579 B1* 1/2018 Huang ................. H05K 1/0203
10,032,705 B2* 7/2018 Lee ....................... H10W 70/05
10,128,179 B2* 11/2018 Kim ...................... H10W 70/65
10,332,818 B2* 6/2019 Morianz ................ H05K 1/185
10,714,359 B2* 7/2020 Cheng ................... H10W 90/00
10,763,216 B2* 9/2020 Braunisch ........... H10W 70/611
10,881,004 B1* 12/2020 Lee ........................ H05K 1/185
10,888,001 B2* 1/2021 Lin ...................... H05K 3/4602
10,892,227 B2* 1/2021 Kim .................... H10W 70/614
11,075,193 B2* 7/2021 Kang ...................... H10P 72/74
11,289,468 B2* 3/2022 Fu ........................... H10P 72/74
11,424,192 B2* 8/2022 Yamanishi .......... H10W 70/614
11,439,021 B2* 9/2022 Jeong ..................... H05K 1/186
11,715,697 B2 8/2023 Kim et al.
11,735,532 B2* 8/2023 Kim ........................ H10P 72/74 257/664
11,735,575 B2* 8/2023 Horibe ................ H10W 70/611 438/106
12,249,519 B2* 3/2025 Shah ................... H10W 74/017
2002/0020898 A1* 2/2002 Vu ...................... H10W 74/019 257/676
2002/0033275 A1* 3/2002 Sumi ...................... H05K 1/095 174/262
2003/0155638 A1* 8/2003 Ito ....................... H10W 74/019 257/E21.503
2004/0160751 A1* 8/2004 Inagaki .................. H05K 1/181 257/E23.079
2006/0272853 A1* 12/2006 Muramatsu ............. H10P 72/74 257/E23.079
2007/0074900 A1* 4/2007 Lee ........................ H05K 1/185 257/E23.178
2008/0157316 A1* 7/2008 Yang ..................... H10W 90/00 257/685
2008/0197469 A1* 8/2008 Yang ..................... H10W 90/00 438/118
2009/0215231 A1* 8/2009 Inoue .................. H10W 70/614 257/E21.02
2010/0288544 A1* 11/2010 Kariya .................. H10W 70/65 174/258
2012/0013021 A1* 1/2012 Kobayashi .......... H10W 70/614 257/E21.597
2014/0054073 A1 2/2014 Lee et al.
2015/0156882 A1* 6/2015 Bong ..................... H05K 1/185 257/690
2015/0259194 A1* 9/2015 Lin ......................... B81B 7/007 257/773
2016/0302308 A1* 10/2016 Lee ...................... H05K 3/4694
2017/0221848 A1* 8/2017 Iguchi ................. H10W 20/496
2018/0247887 A1* 8/2018 Park .................... H10W 70/095
2018/0358292 A1* 12/2018 Kong .................. H10W 20/496
2019/0013263 A1* 1/2019 Kyozuka ............. H10W 70/685
2019/0380212 A1* 12/2019 Chien ................. H05K 3/4623
2020/0015357 A1* 1/2020 Kim ....................... H05K 1/181
2020/0035591 A1* 1/2020 Hu ...................... H10W 70/614
2020/0105653 A1* 4/2020 Elsherbini ................. G05F 1/46
2020/0219833 A1* 7/2020 Lee ..................... H10W 70/611
2020/0294915 A1* 9/2020 Chu ........................ H10P 72/74
2020/0344881 A1 10/2020 Tonaru et al.
2021/0185822 A1* 6/2021 Lee ........................ H05K 1/186
2021/0280517 A1* 9/2021 May ........................ H10P 72/74
2023/0063578 A1* 3/2023 Cho .................... H10W 90/701
2023/0171900 A1 6/2023 Choi et al.
2023/0378094 A1* 11/2023 Park .................... H10W 42/121
2023/0411268 A1 12/2023 Yoo et al.
2024/0021530 A1* 1/2024 Jeon ...................... H10W 70/65
2024/0047418 A1* 2/2024 Yim ........................ H10P 72/74
2025/0063668 A1* 2/2025 Mok ...................... H05K 1/115
2025/0118648 A1* 4/2025 Carpenter ............. H10W 42/20

FOREIGN PATENT DOCUMENTS

KR 10-2014-0027731 A 3/2014
KR 10-2021-0076292 A 6/2021
KR 10-2023-0145844 A 10/2023
KR 10-2023-0172434 A 12/2023

* cited by examiner

【FIG. 1A】
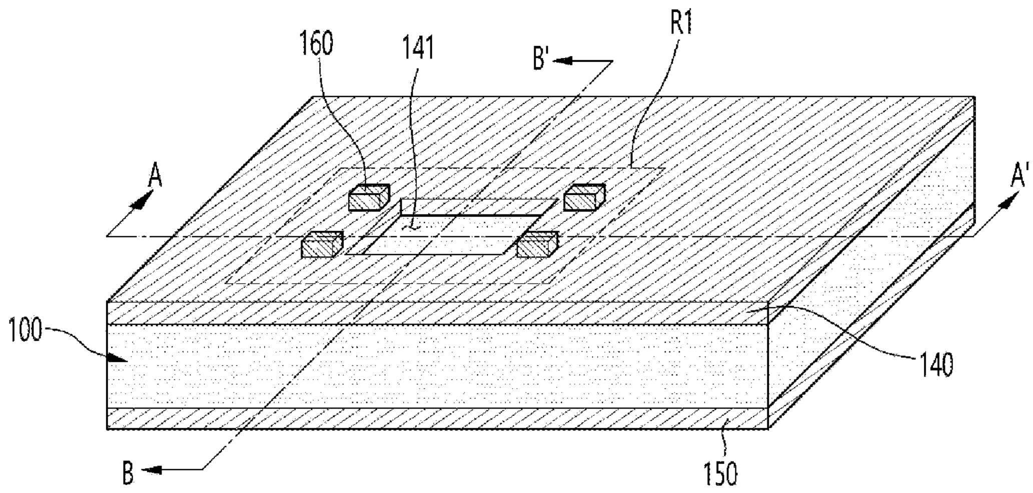
【FIG. 1B】
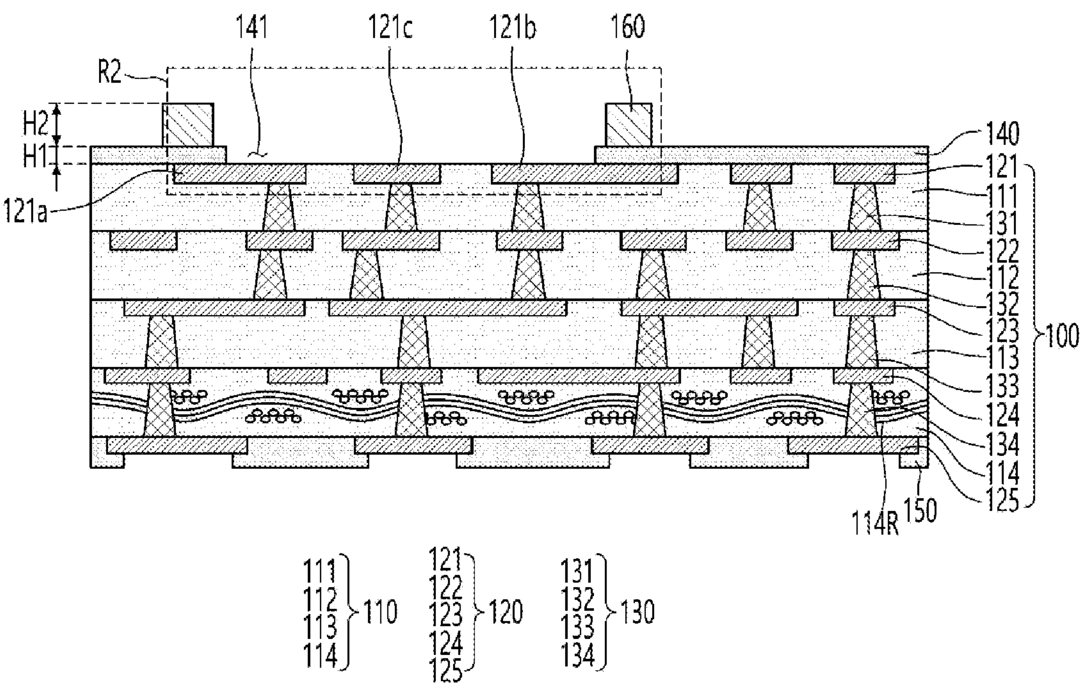

【FIG. 1C】
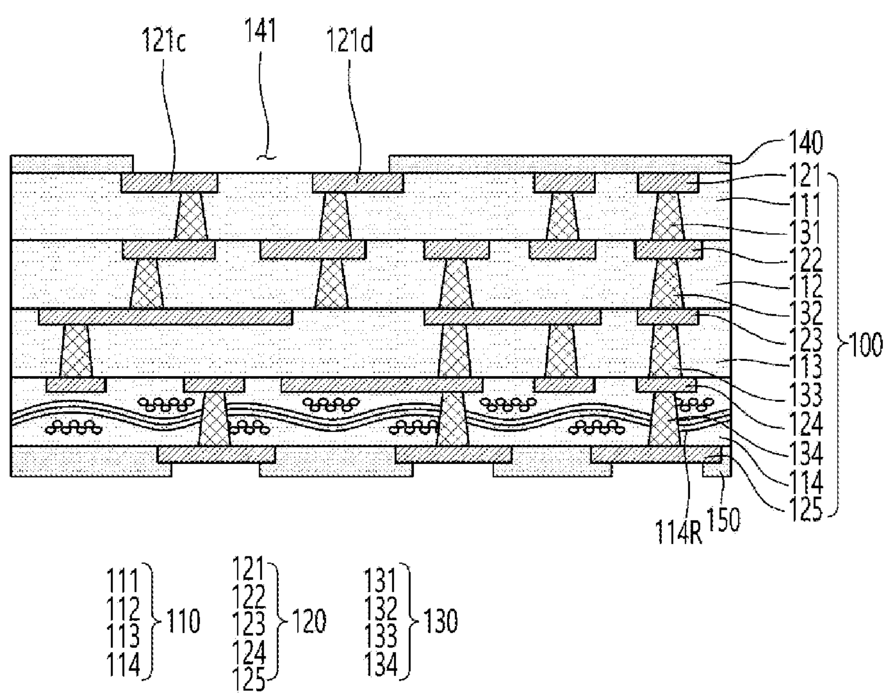

【FIG. 1D】
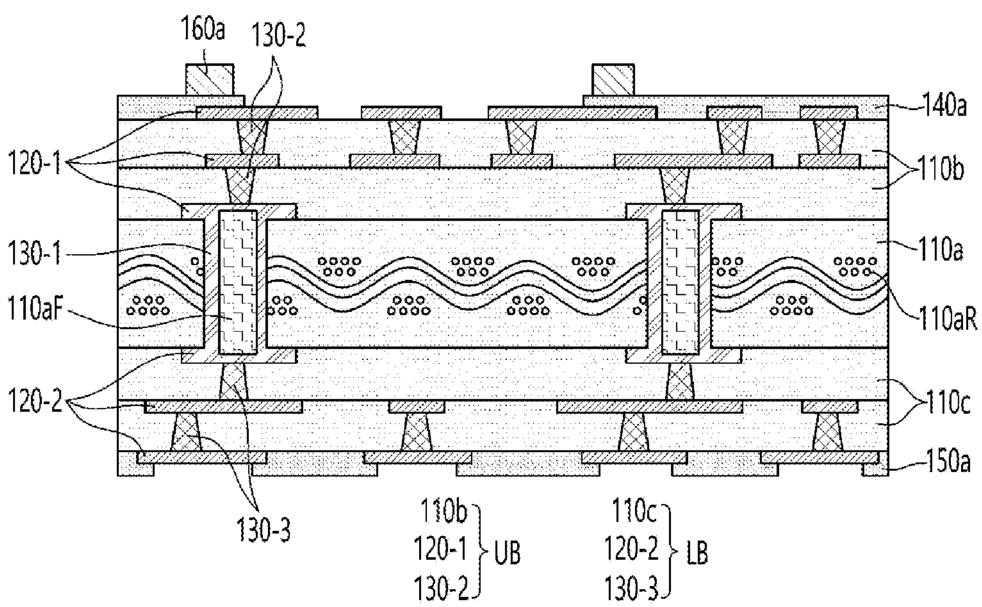

【FIG. 2A】
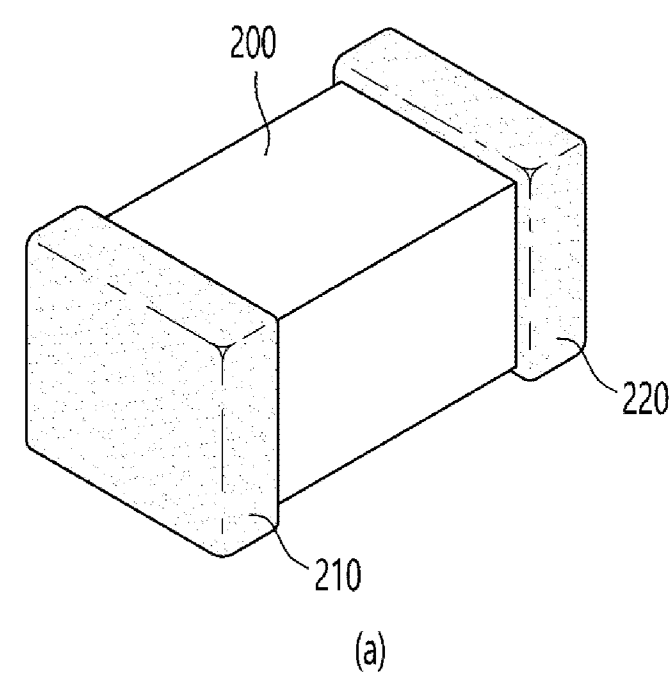
(a)
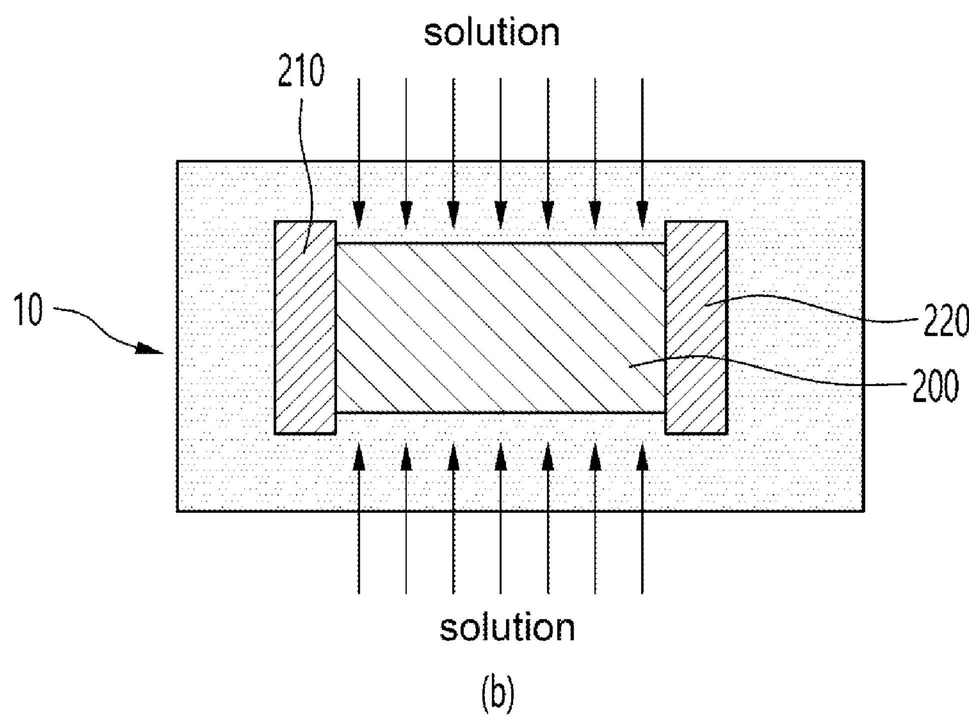
(b)

【FIG. 2B】
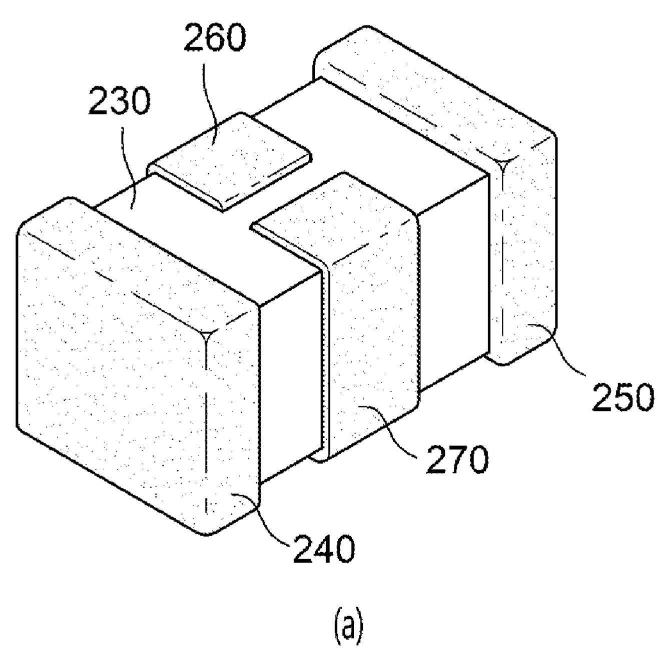
(a)
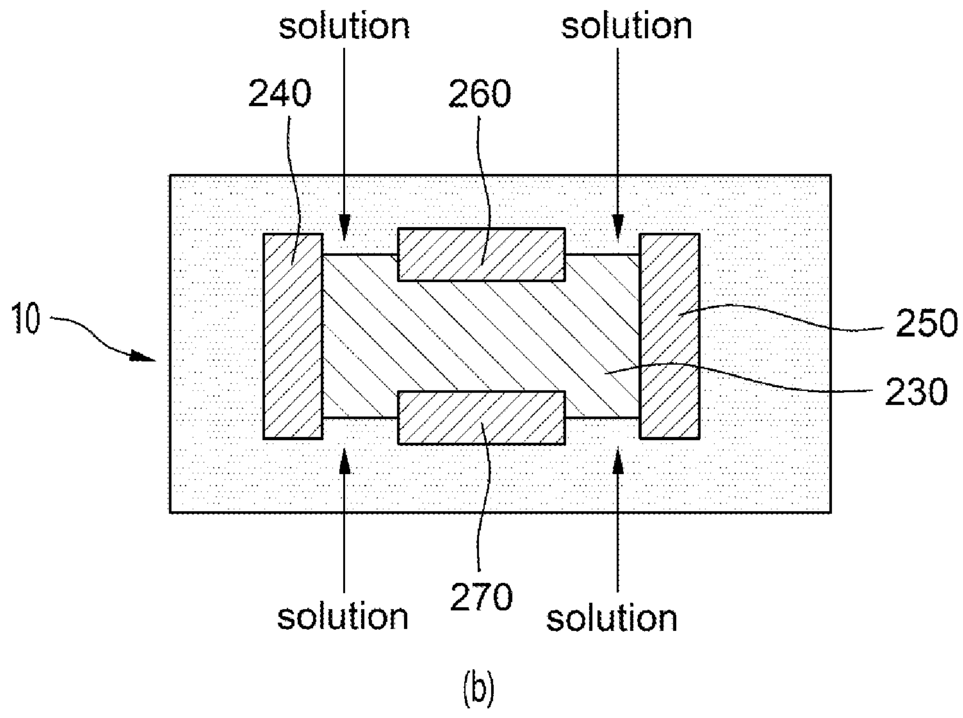
(b)

【FIG. 3A】
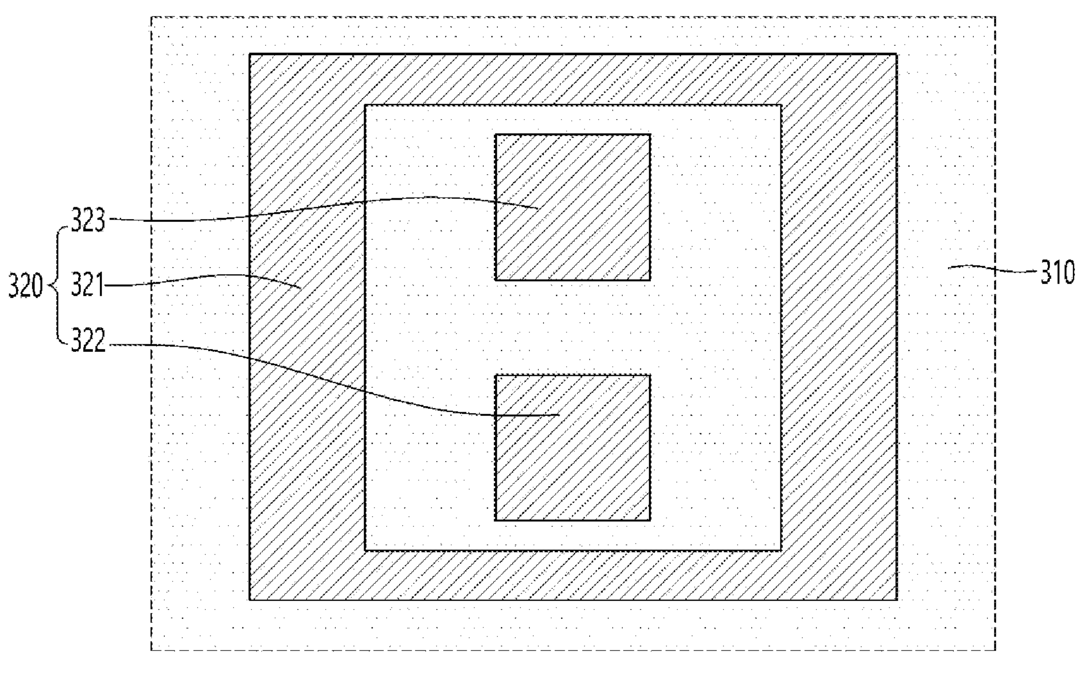
【FIG. 3B】
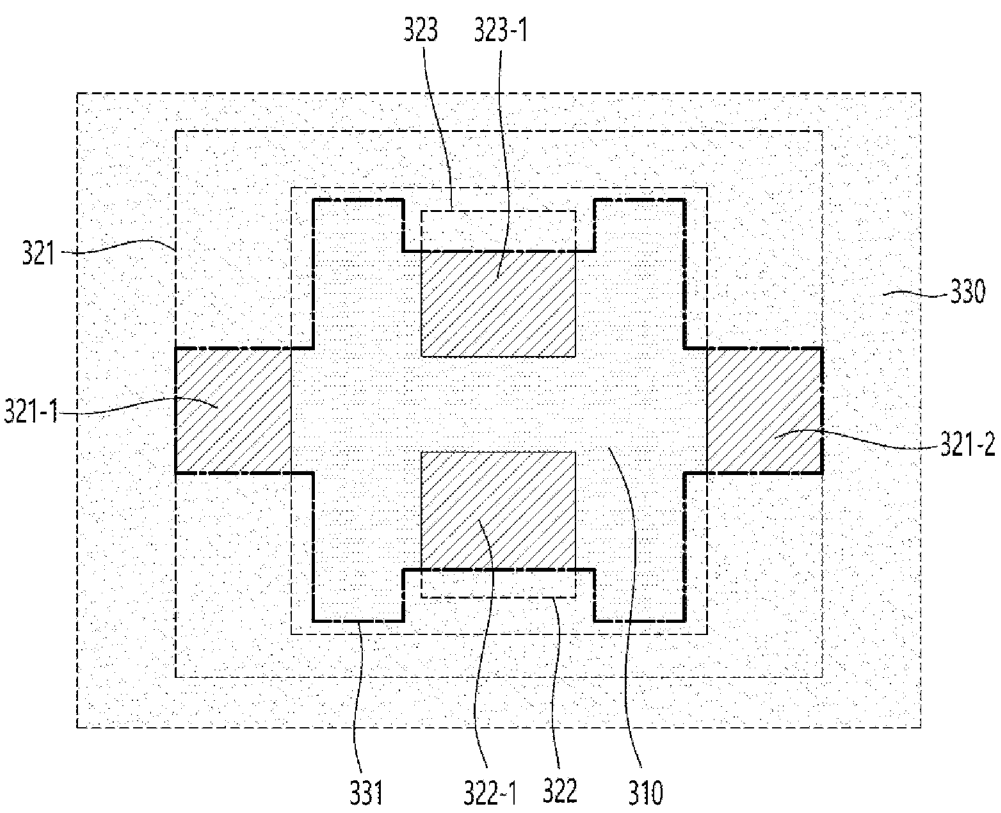

【FIG. 3C】
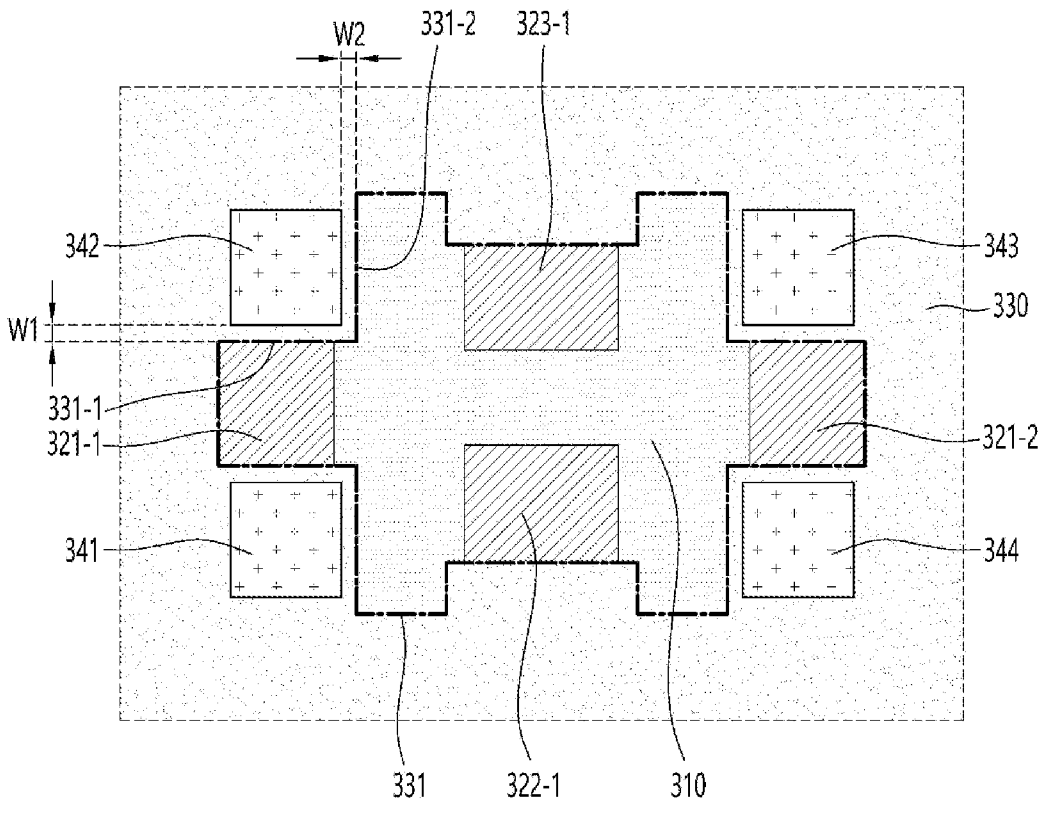
【FIG. 4A】
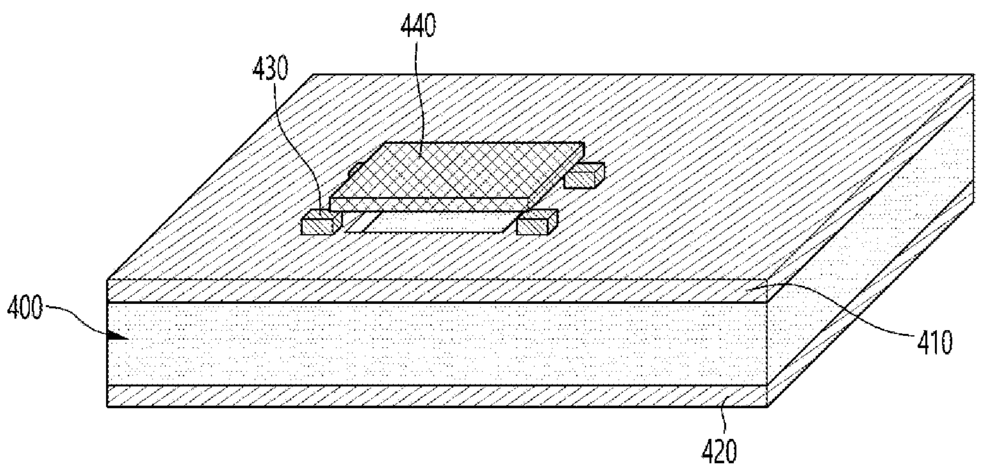

【FIG. 4B】
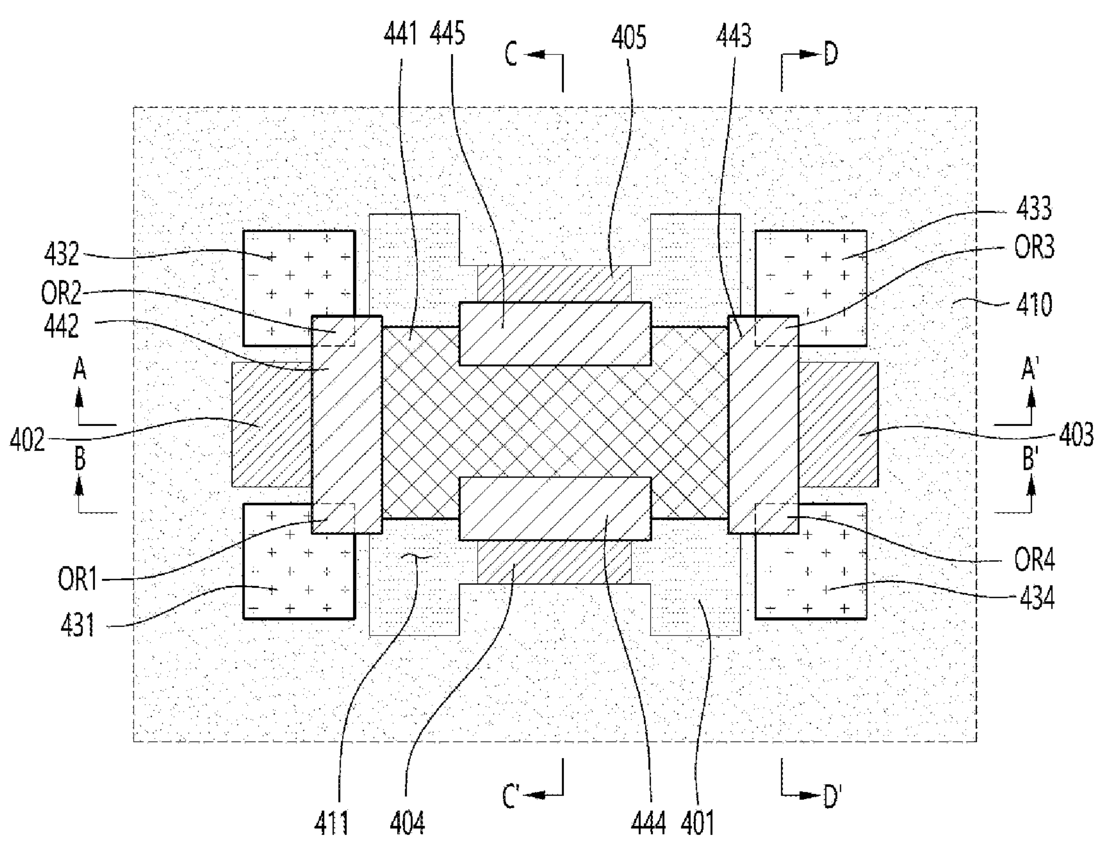

【FIG. 4C】
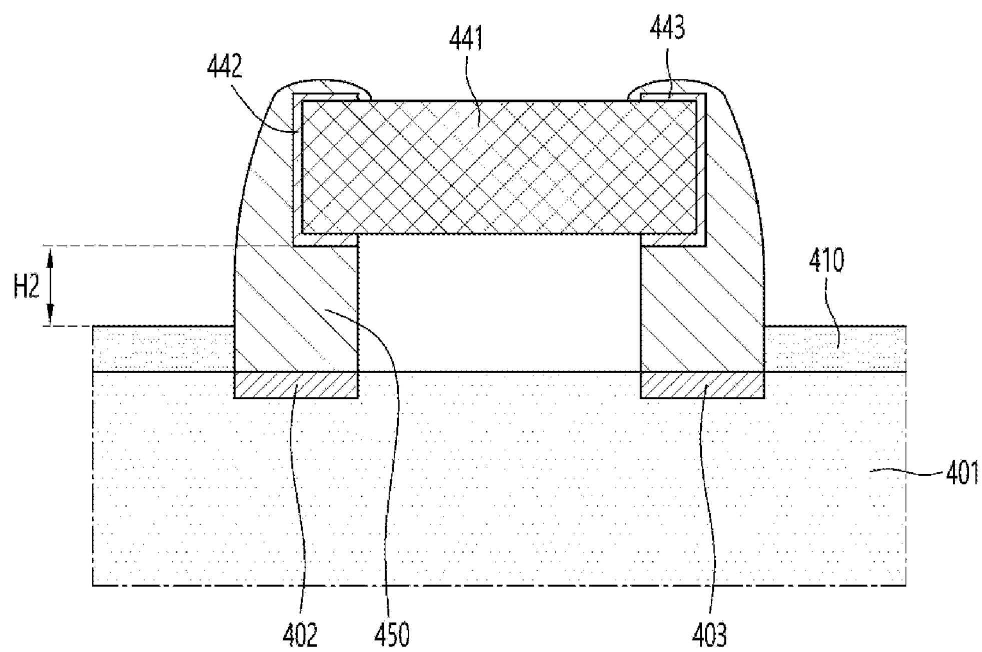

【FIG. 4D】
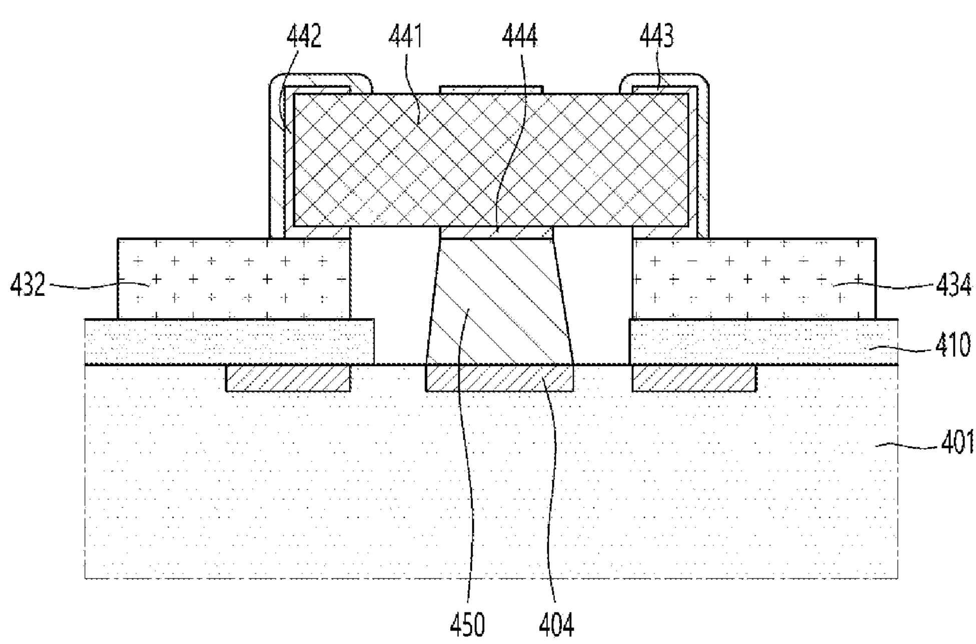

【FIG. 4E】
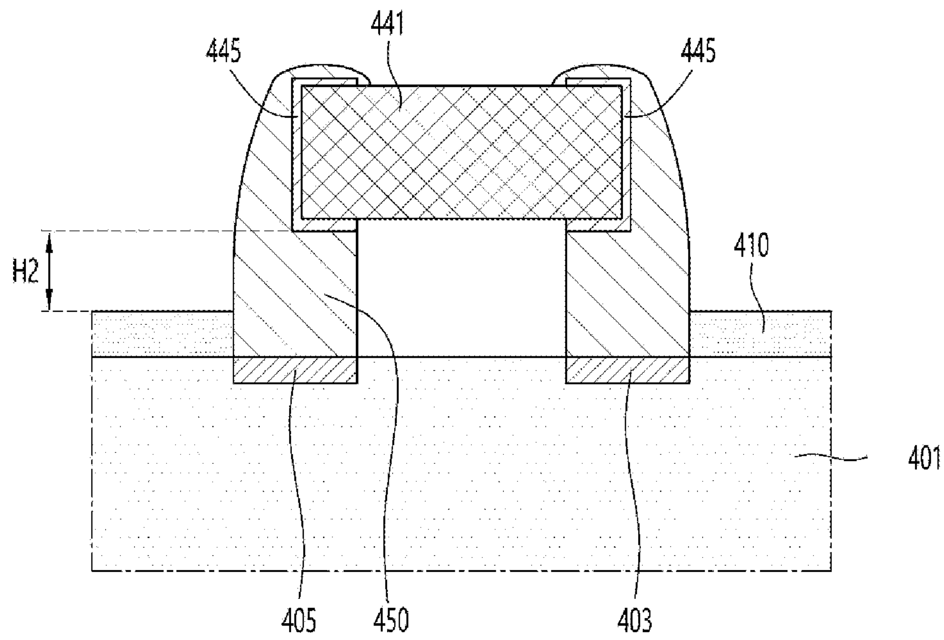

【FIG. 4F】
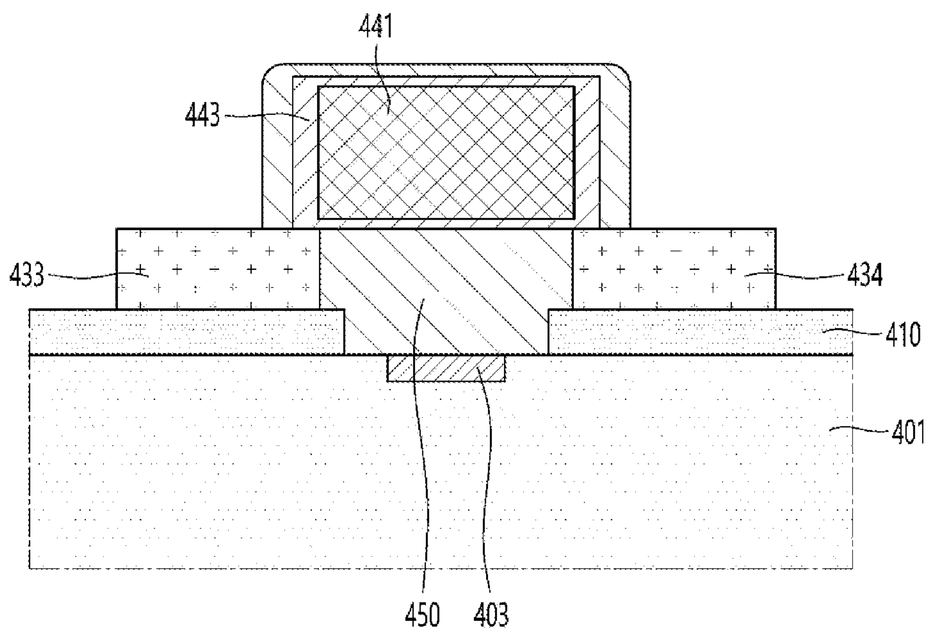
【FIG. 5】
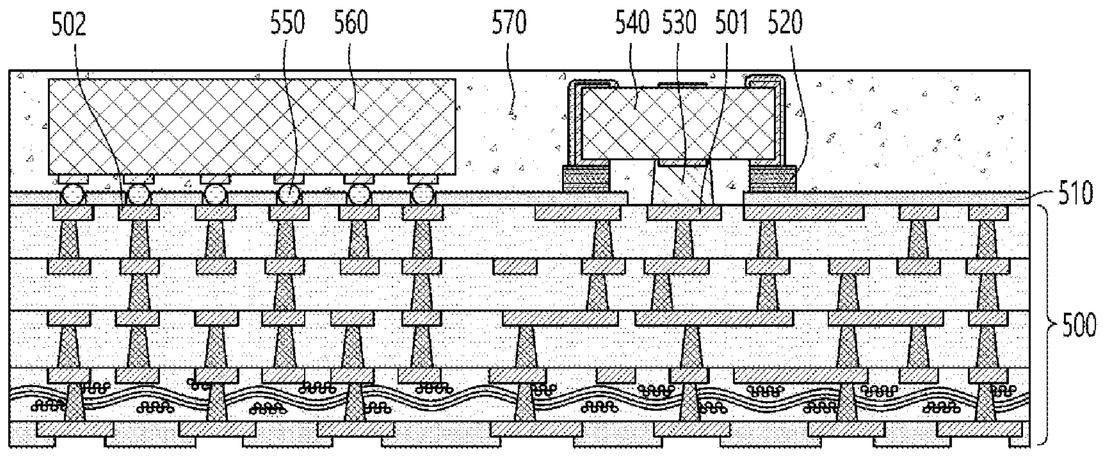

[FIG. 6]
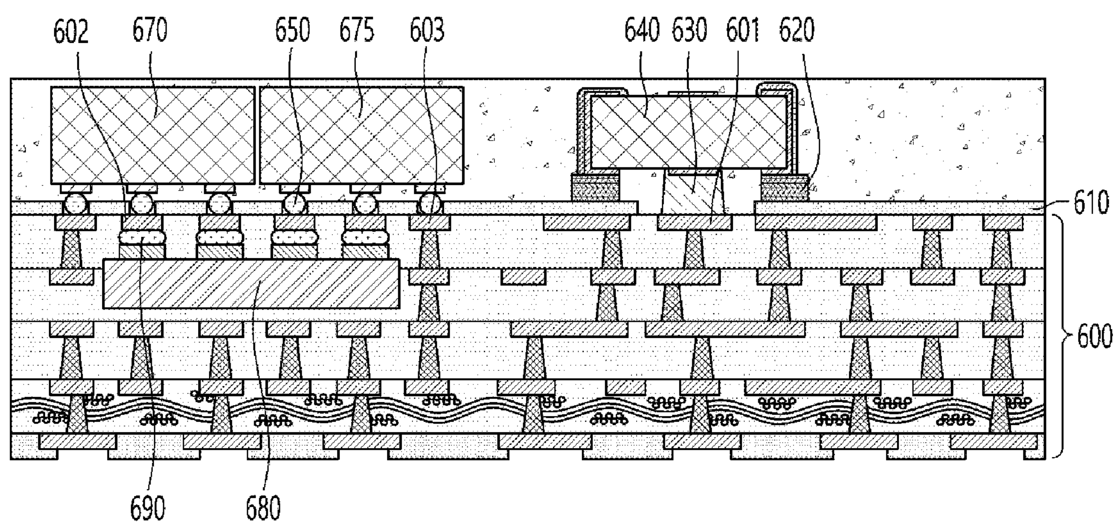
[FIG. 7]
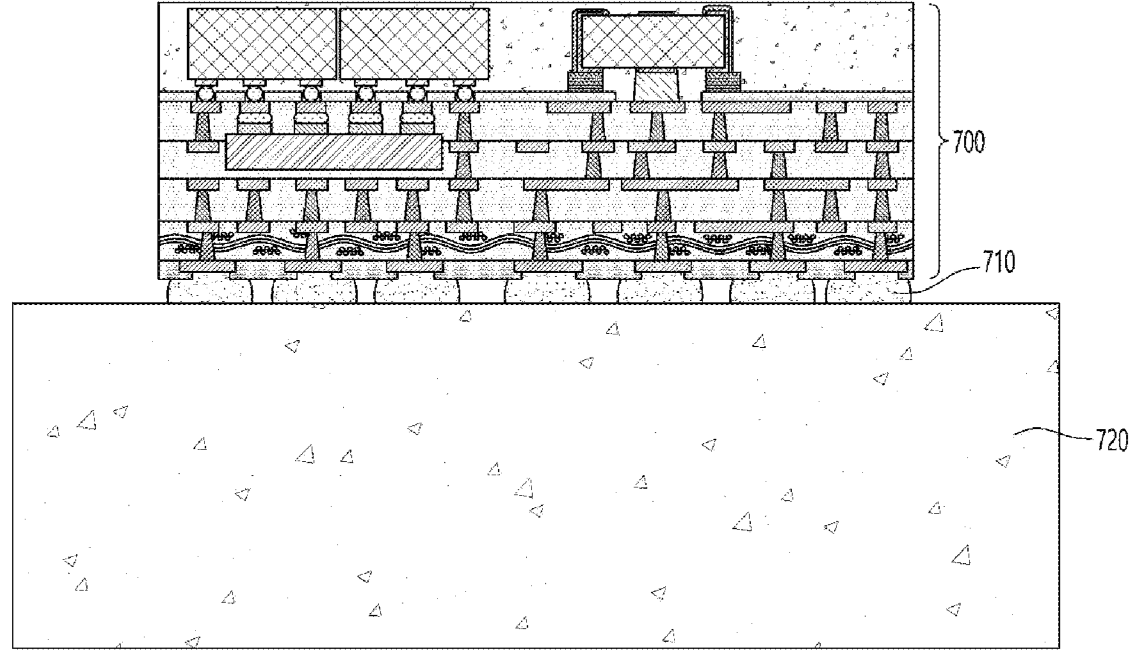

CIRCUIT BOARD AND SEMICONDUCTOR PACKAGE HAVING THE SAME

CROSS-REFERENCE TO RELATED APPLICATIONS

The present application claims priority under 35 U.S.C. 119 and 35 U.S.C. 365 to Korean Patent Application No. 10-2024-0000322, filed on Jan. 2, 2024, which is hereby incorporated by reference in its entirety.

BACKGROUND

Technical Field

The embodiment relates to a circuit board, and particularly to a circuit board with improved electrical reliability and a semiconductor package including the same.

Discussion of the Related Art

As the performance of electrical/electronic products progresses, technologies for arranging a greater number of semiconductor devices on a limited-sized semiconductor package substrate are being proposed and researched. However, since general semiconductor packages are based on mounting a single semiconductor device, there are limitations in obtaining the desired performance.

Accordingly, recently, a semiconductor package in which a plurality of semiconductor devices is arranged using a plurality of substrates have been provided. Such a semiconductor package has a structure in which a plurality of semiconductor devices are connected to each other in horizontal and/or vertical directions on a substrate. Accordingly, the semiconductor package has the advantage of efficiently using a mounting area of the semiconductor device and enabling high-speed signal transmission through a short signal transmission path between the semiconductor devices.

In addition, the semiconductor package applied to products that provide the Internet of Things (IoT), self-driving cars, and high-performance servers is increasing in number of semiconductor devices and/or a size of each semiconductor device in accordance with the trend of high integration. In addition, a concept of semiconductor packages is expanding to semiconductor chiplets as functional portions of semiconductor devices are divided.

Meanwhile, the number and/or types of semiconductor devices and/or semiconductor chiplets mounted on circuit boards are diversifying, and accordingly, semiconductor devices and/or semiconductor chiplets are mounted on circuit boards in various ways. For example, a semiconductor device with relatively fine electrodes can be mounted on a circuit board using a connecting member such as a micro ball, and a semiconductor device with relatively large electrodes can be mounted on a circuit board using a connecting member such as a solder paste.

At this time, when mounting a semiconductor device using a connecting member such as solder paste, a reflow process can be performed after applying a solder paste on a pad provided on the circuit board. At this time, the solder paste is provided with flux, and the above-described flux may flow around the pad during the reflow process. The above-described flux flow may contaminate a surface of the circuit board or cause an electrical short circuit problem connecting pads disposed adjacent to each other electrically.

Therefore, the de-flux process to remove the above-described flux is performed after the reflow process.

At this time, a thickness of a recent semiconductor package is decreasing, and as a result, a distance in a vertical direction between the pad provided on the circuit board and a terminal of the semiconductor device may also decrease. If the distance in the vertical direction described above decreases, a solution for the de-flux process may not sufficiently penetrate into a space between the circuit board and the semiconductor device, and this may result in electrical and/or mechanical reliability problems as the flux is not completely removed.

At this time, the above-described problem can be solved by increasing the vertical distance between the pad and the terminal of the semiconductor device to allow the solution for the de-flux process to sufficiently penetrate. However, a semiconductor device using micro balls may be mounted on one circuit board along with the semiconductor device using the solder paste described above. In addition, when increasing the direction in the vertical direction between the pad and the terminal of the semiconductor device to improve the permeability of the above-described de-flux solution, and a size of the micro ball (e.g., width in a horizontal direction and thickness in a vertical direction) may increase, and as a result, a pitch of pads provided on the circuit board may also increase. In this case, it may be difficult to miniaturize the semiconductor package because the area of the circuit board increases, or it may be difficult to place all of the pads connected to the electrodes of the semiconductor device within a limited space.

Therefore, there is a need for a method that can realize a fine pitch of pads provided on a circuit board and increase a distance in the vertical direction between the pad and the semiconductor device to a certain level or more when a coupling member such as solder paste is disposed.

Technical Problem

An embodiment provides a circuit board with a new structure and a semiconductor package including the same.

In addition, the embodiment provides a circuit board capable of securing a space for penetration of a solution for de-flux and a semiconductor package including the same.

In addition, the embodiment provides a circuit board that can prevent flux that has escaped from an adhesive member from remaining and a semiconductor package including the same.

In addition, the embodiment provides a circuit board that can increase a distance in a vertical direction from a semiconductor device while implementing a fine pitch of pads, and a semiconductor package including the same.

In addition, the embodiment provides a circuit board having a structure that can improve injection characteristics of a molding member and a semiconductor package including the same.

Technical problems to be solved by the proposed embodiments are not limited to the above-mentioned technical problems, and other technical problems not mentioned may be clearly understood by those skilled in the art to which the embodiments proposed from the following descriptions belong.

SUMMARY OF THE INVENTION

A circuit board according to an embodiment comprises a build-up structure including a plurality of insulating layers stacked along a vertical direction; a protective layer disposed on the build-up structure; and a plurality of insulating members disposed on the protective layer and spaced apart from each other.

In addition, a material of the plurality of insulating members is same as a material of the protective layer.

In addition, a thickness of each of the plurality of insulating members in a vertical direction is greater than a thickness of the protective layer in the vertical direction.

In addition, the thickness of each of the plurality of insulating members in the vertical direction is between 1.2 and 5 times the thickness of the protective layer in the vertical direction.

In addition, the build-up structure includes a pad part disposed on its upper surface, and wherein the plurality of insulating members are spaced apart from each other in a peripheral region of the pad part on the protective layer.

In addition, the protective layer has a through hole exposing the pad part from the protective layer, and where the plurality of insulating members are spaced apart from each other in a region surrounding the through hole.

In addition, each of the plurality of insulating members is misaligned from the through hole of the protective layer along the vertical direction.

In addition, each of the plurality of insulating members is spaced apart from the through hole of the protective layer by a predetermined distance along a horizontal direction.

In addition, the distance is greater than a thickness of the protective layer in the vertical direction.

In addition, the distance is smaller than the thickness of each of the plurality of insulating members in the vertical direction.

In addition, the pad part includes a plurality of pads, and wherein an area of an upper surface of at least one pad among the plurality of pads is greater than an area of an upper surface of each of the plurality of insulating members.

Meanwhile, the semiconductor package according to the embodiment comprises a build-up insulating layer including a plurality of insulating layers stacked along a vertical direction; a pad part disposed on an upper surface of the build-up insulating layer; a protective layer disposed on the build-up insulating layer and having a through hole overlapping along the vertical direction with the pad part, and a plurality of insulating members disposed on the protective layer and spaced apart from each other along a horizontal direction around the through hole.

In addition, a thickness of the plurality of insulating members is greater than a thickness of the protective layer.

In addition, the plurality of insulating members are formed integrally with the protective layer.

In addition, a material of the plurality of insulating members is same as a material of the protective layer.

In addition, each of the plurality of insulating members includes an upper surface, wherein the pad part includes a plurality of pads, wherein each of the plurality of pads includes an upper surface, and wherein the upper surface of at least one of the plurality of insulating members has an area smaller than an area of the upper surface of at least one of the plurality of pads.

In addition, the semiconductor package further comprises a semiconductor device disposed on the plurality of insulating members.

In addition, the semiconductor device includes a plurality of electrodes, and wherein the plurality of electrodes include an overlapping electrode that overlaps the insulating member in the vertical direction, and a non-overlapping electrode that does not overlap the insulating member in the vertical direction.

In addition, the semiconductor package further comprises a conductive adhesive disposed between the semiconductor device and the pad part, wherein the conductive adhesive is overlapped with the insulating member in the horizontal direction.

In addition, the conductive adhesive has at least a portion extending between the overlapping electrode of the semiconductor device and the insulating member.

Effects of the Invention

A circuit board according to an embodiment can include a build-up structure including a plurality of insulating layers stacked along a vertical direction, a protective layer placed on the build-up structure, and a plurality of insulating members disposed on the protective layer and spaced apart from each other. That is, the embodiment may place an insulating member in a local region on the protective layer, and use the above-described insulating member to increase the distance in the vertical direction between an upper surface of the build-up structure and the lower surface of the semiconductor device. Accordingly, the embodiment allows sufficient space for the solution for de-flux to penetrate.

In other words, the insulating member can function to maintain the vertical separation distance between the upper surface of the build-up structure and the lower surface of the semiconductor device at a predetermined distance. The insulating member allows a de-flux solution to easily penetrate into a space between the upper surface of the build-up structure and the lower surface of the semiconductor device, thereby preventing flux from remaining on the build-up structure. In addition, the insulating member allows a molding member, which will be described later, to easily flow into the space between the upper surface of the build-up structure and the lower surface of the semiconductor device, and through this, the semiconductor device can be stably molded with the molding member. Accordingly, the embodiment can stably protect the semiconductor device from external substances such as moisture and enable the semiconductor device to operate more stably.

In addition, a vertical thickness of the protective layer may be smaller than a vertical thickness of the insulating member, which can solve the problem of circuit board bending that occurs as a stress acting on the insulating member increases. Furthermore, the embodiment can prevent the width and thickness of the adhesive member from increasing in the region where the bonding method using micro balls is used. Additionally, the embodiment can improve circuit integration by refining the pitch of pads in the bonding region using micro balls. Through this, the embodiment ensures sufficient space for the solution for de-flux to penetrate, thereby solving problems of electrical short-circuiting and/or surface contamination that may occur due to residual flux.

The insulating member may be placed around the pad part on the protective layer. For example, the insulating member may include first to fourth insulating members that are spaced apart from each other, and accordingly, this ensures space for the solution to penetrate through different regions for de-flux. In addition, this can solve electrical short-circuit problems and/or surface contamination problems that may occur due to residual flux.

Furthermore, the embodiment may allow a plurality of insulating members to be disposed in a region between each of a plurality of pads, and may allow the semiconductor device to be more stably seated on the circuit board. For example, if an insulating member is placed only in a specific region, a problem may occur in which a semiconductor device is mounted at an angle on a circuit board, which may reduce the electrical and/or mechanical reliability of the circuit board and semiconductor package. Accordingly, the embodiment allows the first to fourth insulating members to be disposed between each pad, so that the semiconductor device disposed on the circuit board can be stably supported. Accordingly, a flatness of the semiconductor device can be improved and the semiconductor device can be mounted more stably. Accordingly, the embodiment can enable the semiconductor device to operate more stably.

BRIEF DESCRIPTION OF THE DRAWINGS

FIG. 1A is a perspective view schematically showing a circuit board according to an embodiment.

FIG. 1B is a cross-sectional view taken along a A-A' direction of the circuit board of FIG. 1A according to a first embodiment.

FIG. 1C is a cross-sectional view taken along a B-B' direction of the circuit board of FIG. 1A according to a first embodiment.

FIG. 1D is a cross-sectional view taken along the A-A' direction of the circuit board of FIG. 1A according to a second embodiment.

FIG. 2A (a) is a perspective view showing a two-phase MLCC.

FIG. 2A (b) is a plan view showing a two-phase MLCC after being mounted on a circuit board.

FIG. 2B (a) is a perspective view showing a three-phase MLCC.

FIG. 2B (b) is a plan view showing a three-phase MLCC after being mounted on a circuit board.

FIG. 3A is a top view of a region (R1) in FIG. 1A and of a region (R2) in FIG. 1B before a protective layer and insulating member are disposed.

FIG. 3B is a plan view of a protective layer having a through hole in FIG. 3A being disposed.

FIG. 3C is a top view of an insulating member disposed on a protective layer in FIG. 3B.

FIG. 4A is a perspective view schematically showing a semiconductor package according to a first embodiment.

FIG. 4B is a top view of a semiconductor device mounted on a circuit board in FIG. 3C.

FIG. 4C is a cross-sectional view taken along a A-A' direction in FIG. 4B.

FIG. 4D is a cross-sectional view taken along a B-B' direction in FIG. 4B.

FIG. 4E is a cross-sectional view taken along a C-C' direction in FIG. 4B.

FIG. 4F is a cross-sectional view taken along a D-D' direction in FIG. 4B.

FIG. 5 is a cross-sectional view showing a semiconductor package according to a second embodiment.

FIG. 6 is a cross-sectional view showing a semiconductor package according to a third embodiment.

FIG. 7 is a cross-sectional view showing a semiconductor package according to a fourth embodiment.

DETAILED DESCRIPTION OF THE EMBODIMENTS

Hereinafter, embodiments of the present invention will be described in detail with reference to the accompanying drawings.

However, the spirit and scope of the present invention is not limited to a part of the embodiments described, and may be implemented in various other forms, and within the spirit and scope of the present invention, one or more of the elements of the embodiments may be selectively combined and replaced.

In addition, unless expressly otherwise defined and described, the terms used in the embodiments of the present invention (including technical and scientific terms may be construed the same meaning as commonly understood by one of ordinary skill in the art to which this invention belongs, and the terms such as those defined in commonly used dictionaries may be interpreted as having a meaning that is consistent with their meaning in the context of the relevant art. Further, the terms used in the embodiments of the present invention are for describing the embodiments and are not intended to limit the present invention.

In this specification, the singular forms may also include the plural forms unless specifically stated in the phrase, and may include at least one of all combinations that may be combined in A, B, and C when described in “at least one (or more) of A (and), B, and C”. Further, in describing the elements of the embodiments of the present invention, the terms such as first, second, A, B, (a), and (b) may be used.

These terms are only used to distinguish the elements from other elements, and the terms are not limited to the essence, order, or order of the elements. In addition, when an element is described as being “connected”, “coupled”, or “contacted” to another element, it may include not only when the element is directly “connected” to, “coupled” to, or “contacted” to other elements, but also when the element is “connected”, “coupled”, or “contacted” by another element between the element and other elements.

In addition, when described as being formed or disposed “on (over)” or “under (below)” of each element, the “on (over)” or “under (below)” may include not only when two elements are directly connected to each other, but also when one or more other elements are formed or disposed between two elements. Further, when expressed as “on (over)” or “under (below)”, it may include not only the upper direction but also the lower direction based on one element.

It will be understood that the terms “comprise”, “include”, or “have” specify the presence of stated features, integers, steps, operations, elements, components and/or groups thereof disclosed in the present specification, but do not preclude the possibility of the presence or addition of one or more other features, integers, steps, operations, elements, components, and/or groups thereof.

Unless otherwise defined, all terms used herein, including technical or scientific terms, have the same meaning as commonly understood by a person of ordinary skill in the technical field to which the present invention pertains. Terms defined in commonly used dictionaries should be interpreted as having meanings consistent with the meanings they have in the context of the relevant technology. Unless explicitly defined in this application, it is not to be interpreted in an idealistic or overly formal sense.

Hereinafter, the embodiment will be described in detail with reference to the attached drawings, but identical or corresponding components will be assigned the same reference numbers regardless of the reference numerals, and duplicate descriptions thereof will be omitted.

Before describing the embodiment, an electronic device (not shown) to which the semiconductor package of the embodiment is applied will be briefly described. An electronic device may be a smart phone, a personal digital assistant, a digital video camera, a digital still camera, a vehicle, a high-performance server, a network system, computer, monitor, tablet, laptop, netbook, television, video game, smart watch, automotive, or the like. However, the embodiment is not limited thereto, and may be any other electronic device that processes data in addition to these.

The electronic device includes a main board (not shown). The main board may be physically and/or electrically connected to various components. For example, the main board may be connected to a semiconductor package of an embodiment. In addition, the semiconductor package includes a circuit board, a semiconductor chip, a bonding part that electrically connects the semiconductor device and the circuit board, a resin part that fills the space between the semiconductor device and the circuit board, and a molding part that entirely surrounds the semiconductor device.

A semiconductor device may include an active device and/or a passive device and may have various functions. The active device may be a semiconductor chip in the form of an integrated circuit (IC) in which hundreds to millions of devices are integrated in one chip. The semiconductor device may be a logic chip, a memory chip, or the like. The logic chip may be a central processor (CPU), a graphics processor (GPU), or the like. For example, the logic chip may be an application processor (AP) chip including at least one of a central processor (CPU), a graphics processor (GPU), a digital signal processor, a cryptographic processor, a microprocessor and a microcontroller, or an analog-digital converter, an application-specific IC (ASIC), or the like, or a chip set comprising a specific combination of those listed so far. The memory chip may be a stack memory such as HBM. The memory chip may also include a memory chip such as volatile memory (e.g., DRAM), non-volatile memory (e.g., ROM), flash memory, and the like. Additionally, the passive device may be a resistor, a capacitor, an inductor, etc., and is not limited to semiconductor materials, and may be, for example, a Multi-Layer Ceramic Capacitor (MLCC).

A product group to which the semiconductor package of the embodiment is applied may be any one of CSP (Chip Scale Package), FC-CSP (Flip Chip-Chip Scale Package), FC-BGA (Flip Chip Ball Grid Array), POP (Package on Package) and SIP (System in Package), but is not limited thereto.

FIG. 1A is a perspective view schematically showing a circuit board according to an embodiment. FIG. 1B is a cross-sectional view taken along a A-A' direction of the circuit board of FIG. 1A according to a first embodiment. FIG. 1C is a cross-sectional view taken along a B-B' direction of the circuit board of FIG. 1A according to a first embodiment. FIG. 1D is a cross-sectional view taken along the A-A' direction of the circuit board of FIG. 1A according to a second embodiment. FIG. 2A (a) is a perspective view showing a two-phase MLCC. FIG. 2A (b) is a plan view showing a two-phase MLCC after being mounted on a circuit board. FIG. 2B (a) is a perspective view showing a three-phase MLCC. FIG. 2B (b) is a plan view showing a three-phase MLCC after being mounted on a circuit board. FIG. 3A is a top view of a region (R1) in FIG. 1B before a protective layer and insulating member are disposed. FIG. 3B is a plan view of a protective layer having a through hole in FIG. 3A being disposed. FIG. 3C is a top view of an insulating member disposed on a protective layer in FIG. 3B. FIG. 4A is a perspective view schematically showing a semiconductor package according to a first embodiment. FIG. 4B is a top view of a semiconductor device mounted on a circuit board in FIG. 3C. FIG. 4C is a cross-sectional view taken along a A-A' direction in FIG. 4B. FIG. 4D is a cross-sectional view taken along a B-B' direction in FIG. 4B. FIG. 4E is a cross-sectional view taken along a C-C' direction in FIG. 4B. FIG. 4F is a cross-sectional view taken along a D-D' direction in FIG. 4B. FIG. 5 is a cross-sectional view showing a semiconductor package according to a second embodiment. FIG. 6 is a cross-sectional view showing a semiconductor package according to a third embodiment. FIG. 7 is a cross-sectional view showing a semiconductor package according to a fourth embodiment.

Hereinafter, a circuit board according to an embodiment and a semiconductor package including the same will be described in detail with reference to FIGS. 1A to 7.

Referring to FIGS. 1A, 1B, and 1C, the circuit board 10 according to the first embodiment can include a build-up structure 100, a protective layer 140 and 150 disposed on one surface and/or other surface of the build-up structure 100, and an insulating member 160 disposed on the one surface of the protective layer 140.

Here, the meaning of being disposed on one surface and other surface is not understood only as a configuration that directly contacts the one surface and the other surface, but it should also be understood that there is a different configuration between one surface of the build-up structure 100 and a first protective layer 140, and between the other surface of the build-up structure 100 and a second protective layer 150.

The build-up structure 100 includes a build-up insulating layer 110, a wiring layer 120, and a through electrode 130.

The build-up insulating layer 110 may have a structure in which a plurality of insulating layers are stacked along a vertical direction. The build-up insulating layer 110 can include a first insulating layer 111 closest to the first protective layer 140 along a vertical direction, a second insulating layer 112 that is farther along the vertical direction from the first protective layer 140 than the first insulating layer 111, a third insulating layer 113 that is farther along the vertical direction from the first protective layer 140 than the second insulating layer 112, and a fourth insulating layer 114 that is further away from the first protective layer 140 in the vertical direction than the third insulating layer 113. In this case, the first insulating layer 111 may refer to an uppermost insulating layer disposed on an uppermost side of the build-up insulating layer 110 having a structure in which a plurality of layers are stacked, and the fourth insulating layer 114 may refer to a lowermost insulating layer disposed on a lowermost side of the build-up insulating layer 110 having a structure in which a plurality of layers are stacked. However, the embodiment is not limited to this, the build-up insulating layer 110 can further include a fifth insulating layer (not shown) disposed between the fourth insulating layer 114 and the second protective layer 125, and a sixth insulating layer (not shown) disposed between the fifth insulating layer (not shown) and the second protective layer 125.

The first to fourth insulating layers 111, 112, 113, and 114 are disposed to insulate in a vertical direction between first to fifth wiring layers 121, 122, 123, 124, and 125, which will be described later. For example, the first to fourth insulating layers 111, 112, 113, and 114 may be made of a thermosetting insulating material containing an inorganic filler in a resin, or Ajinomoto's ABF (Ajinomoto Build-up Film). However, the embodiment is not limited to this, and it can use photo-curable insulating materials (Photo Image-able Dielectric, PID) to form fine patterns.

At least one of the first to fourth insulating layers 111, 112, 113, and 114 may have an insulating material different from at least the other one. Exemplarily, at least one of the first to fourth insulating layers 111, 112, 113, and 114 may include a reinforcement member 114R. In one embodiment, the reinforcement member 114R may refer to a glass fiber. In another embodiment, the reinforcement member 114R may refer to GCP (Glass Core Primer). The reinforcement member 114R may be provided in at least one of the first to fourth insulating layers 111, 112, 113, and 114 to improve a rigidity of the circuit board 10. The reinforcing member 114R prevents the circuit board 10 from being greatly bent in a specific direction, thereby improving the positional alignment of the wiring layer 120 and the through electrode 130. In addition, this may improve the electrical and/or mechanical reliability of the circuit board 10 and semiconductor package. Additionally, the reinforcing member 114R can improve the rigidity of the circuit board 10, thereby improving process characteristics in a process of mounting a semiconductor device on the circuit board 10, and improving product yield. Accordingly, the reinforcement member 114R can enable the semiconductor device to be stably mounted on the circuit board 10 and allow the semiconductor device to operate stably. Through this, it is possible to improve operational reliability by ensuring that electronic products such as servers to which semiconductor packages are applied operate stably. As shown in FIG. 1B or 1C, a reinforcement member 114R may be provided in a fourth insulating layer 114. That is, the circuit board 10 may be manufactured with a carrier member (not shown) disposed, and the fourth insulating layer 114 may be the layer furthest from the carrier member. At this time, when the reinforcement member 114R is disposed in the fourth insulating layer 114, the circuit board 10 can be further prevented from bending in a specific direction during a process of removing the carrier member. However, the embodiment is not limited to this, and the reinforcement member 114R may be provided in an insulating layer other than the fourth insulating layer 114. Exemplarily, the reinforcing members 114R may be alternately arranged along the vertical direction in the first to fourth insulating layers 111, 112, 113, and 114, and through this, the rigidity of the circuit board 10 can be further improved.

A wiring layer 120 can include a first wiring layer 121 closest to the first protective layer 140 along the vertical direction, a second wiring layer 122 farther away from the first protective layer 140 than the first wiring layer 121, a third wiring layer 123 farther away from the first protective layer 140 than the second wiring layer 122, a fourth wiring layer 124 farther away from the first protective layer 140 than the third wiring layer 121, and a fifth wiring layer 125 farther away from the first protective layer 140 than the fourth wiring layer 124. The wiring layer 120 may, for example, have an Embedded Trace Substrate (ETS) structure to implement a fine pattern. Specifically, the wiring layer disposed on an uppermost or lowermost side among the first to fifth wiring layers 121, 122, 123, 124, and 125 may be embedded in the build-up insulating layer 110. Here, embedded means that at least a portion of a side surface of the wiring layer having the ETS structure is covered with the build-up insulating layer 110. The first wiring layer 121 may be embedded in the first insulating layer 121. The first wiring layer 121 is the wiring layer closest to the semiconductor device disposed on the circuit board 10. At this time, when manufacturing the first wiring layer 121 through the ETS method, pads and traces constituting the first wiring layer 121 can be stably protected with an insulating layer, enabling miniaturization and improving the circuit integration of the first wiring layer 121. Accordingly, the semiconductor device disposed on the circuit board 10 can be more easily electrically connected, and the semiconductor device can operate more stably.

According to an embodiment with an ETS structure, a concave recess may be provided at an upper surface of the first insulating layer 111 toward a lower surface of the first build-up insulating layer 110, and the first wiring layer 121 may be disposed in a recess of the first insulating layer 111. Additionally, the second wiring layer 122 may be disposed in a recess provided at an upper surface of the second insulating layer 112, the third wiring layer 123 may be disposed in a recess provided at an upper surface of the third insulating layer 113, a fourth wiring layer 124 may be disposed in a recess provided at an upper surface of the fourth insulating layer 114, and a fifth wiring layer 125 may protrude below a lower surface of the fourth insulating layer 114. Therefore, as described above, circuit integration can be improved by miniaturizing the first to fifth wiring layers 121, 122, 123, 124, and 125. Accordingly, the embodiment can protect the first to fifth wiring layers 121, 122, 123, 124, and 125 from contaminants such as external moisture and improve the reliability of the semiconductor package.

The first to fifth wiring layers 121, 122, 123, 124 and 125 can include traces that transmit signals and/or power, respectively, and pads for connecting traces of each of the first to fifth wiring layers 121, 122, 123, 124, and 125 with other components. Exemplarily, referring to FIG. 1B or 1C, the first wiring layer 121 and the second wiring layer 122 are connected to the first through electrode 131. At this time, in order to connect the traces of the first through electrode 131 and the second wiring layer 122, the second wiring layer 122 may include a pad connected to the first through electrode 131. FIGS. 1B and 1C illustrate only the pads of the first wiring layer 121, but the first wiring layer 121 may further include traces connecting a plurality of pads.

The first to fifth wiring layers 121, 122, 123, 124, and 125 may function to electrically connect a semiconductor device disposed on the circuit board 10. Each of the first to fifth wiring layers 121, 122, 123, 124, and 125 can be freely designed considering impedance.

The first wiring layer 121 may include a plurality of pads 121*a*, 121*b*, 121*c*, and 121*d*. The plurality of pads 121*a*, 121*b*, 121*c*, and 121*d* of the first wiring layer 121 may refer to electrodes connected to terminals of a semiconductor device mounted on the circuit board 10. That is, FIGS. 1B and 1C may show a partial region R1 among an entire region of the circuit board 10, and the first wiring layer 121 may further include additional pads connected to other semiconductor devices in a region other than the region R1. At this time, the plurality of pads 121*a*, 121*b*, 121*c*, and 121*d* may refer to a portion of the first wiring layer 121 that overlaps a through hole 141 of a first protective layer 140, which will be described later, in the vertical direction. Accordingly, at least two of the plurality of pads 121*a*, 121*b*, 121*c*, and 121*d* may mean a region in one integrated pad that overlaps the through hole 141 of the first protective layer 140, which will be described later, along the vertical direction.

Additionally, a through electrode 130 may be disposed in the build-up insulating layer 110 to connect each of the first to fifth wiring layers 121, 122, 123, 124, and 125. The through electrode 130 may include first to fourth through electrodes 131, 132, 133, and 134. Exemplarily, the first through electrode 131 is disposed between the first wiring layer 121 and the second wiring layer 122, the second through electrode 132 is disposed between the second wiring layer 122 and the third wiring layer 123, the third through electrode 133 is disposed between the third wiring layer 123 and the fourth wiring layer 124, and the fourth through electrode 134 is disposed between the fourth wiring layer 124 and the fifth wiring layer 125. The first to fifth wiring layers 121, 122, 123, 124, and 125 are electrically connected to each other through first to fourth through electrodes 131, 132, 133 and 134.

The first to fourth through electrodes 131, 132, 133 and 134 can be performed simultaneously in a process of arranging the second to fifth wiring layers 122, 123, 124 and 125. As an example, in a process of forming the second wiring layer 122 under the first wiring layer 121, a through hole is formed in the first insulating layer 111 to expose a portion of the first wiring layer 121. Through this, the second wiring layer 122 can be formed along with the first through electrode 131 that fills the through hole of the first insulating layer 111. Accordingly, the first through electrode 131 may be divided into a protrusion of the second wiring layer 122. Likewise, each of the second to fourth through electrodes 132, 133 and 134 can be divided by a protrusion of each of the third to fifth wiring layers 123, 234 and 125 and connected to another wiring layer disposed on each wiring layer.

In addition, the first to fifth wiring layers 121, 122, 123, 124 and 125 are sequentially stacked along the vertical direction on the lower surface of the first protective layer 140. For this reason, an inclination direction of each of the first to fourth through electrodes 131, 132, 133, and 134 may be same. Exemplarily, each of first to fourth through electrodes 131, 132, 133 and 134 provided in the build-up structure 100 may have an inclination that increases in width toward the second protective layer 150.

The protective layers 140 and 150 can include a first protective layer 140 disposed on an upper surface of the build-up structure 100 and/or a second protective layer 150 disposed on a lower surface of the build-up structure 100. The first protective layer 140 may protect an upper surface of the first wiring layer 121 and/or the first insulating layer 111 from external moisture or contaminants. Additionally, when a semiconductor device is disposed on the circuit board 10 using a material such as solder, the first protective layer 140 functions to prevent short circuits between solders due to low wettability with the solder. The first protective layer 140 may be made of a photo-curable insulating material, and for example, a solder resist may be used. However, the embodiment is not limited to this, and the first protective layer 140 may include a thermosetting insulating material that is the same insulating material as the build-up insulating layer 110. The first protective layer 140 may be made of the same insulating material as the first insulating layer 111, and for example, the first protective layer 140 may be provided as Ajinomoto Build-up Film (ABF).

The first protective layer 140 may have a through hole 141. The through hole 141 may passes through the first protective layer 140 from the upper surface of the first protective layer 140 toward the lower surface of the first protective layer 140. For example, the first protective layer 140 may include a through hole 141 that exposes at least a portion of the upper surface of the build-up structure 100. The build-up structure 100 may provide a space in which at least one semiconductor device is placed, and the first protective layer 140 may include a through hole 141 that overlaps the above-described space of the build-up structure 100 along a vertical direction. For example, the protective layer 140 may include a through hole 141 that overlaps the plurality of pads 121*a*, 121*b*, 121*c*, and 121*d* of the first wiring layer 121 along a vertical direction.

The insulating member 160 may be locally disposed on the first protective layer 140 disposed on one surface of the build-up structure 100. For example, the insulating member 160 may be an insulating patch disposed on the first protective layer 140, and may be provided in plural numbers on the first protective layer 140 and spaced apart from each other. The insulating member 160 may be provided around the through hole 141 of the first protective layer 140. The insulating member 160 may not overlap or be misaligned with the through hole 141 of the first protective layer 140 in the vertical direction. The insulating member 160 may be provided at a position spaced apart from an inner wall forming the through hole 141 of the first protective layer 140 along a horizontal direction toward an outer surface of the build-up structure 100.

A structure of the circuit board 10 described above is only an example for explaining the present invention, and the technical idea of the present invention is not limited to a stacked structure of this embodiment.

For example, the circuit board according to the embodiment of FIGS. 1B and 1C may be a coreless board without a core layer. For example, the circuit board of the first embodiment may be a circuit board manufactured by the ETS (Embedded Trace Substrate) method, and accordingly, the first to fourth insulating layers 111, 112, 113, and 114 may have a structure in which they are sequentially stacked along a vertical direction from top to bottom.

Alternatively, according to the embodiment of FIG. 1D, the circuit board may be a core board including a core layer. For example, the circuit board of the second embodiment may be a circuit board manufactured by the SAP method or the MSAP method. In this case, as shown in FIG. 1C, the circuit board may include a core layer 110*a*, a first build-up layer UB disposed on one surface of the core layer 110*a*, and a second build-up layer LB disposed on the other surface of the core layer 110*a*.

The core layer 110*a* is composed of a resin such as epoxy resin or BT (bismaleimide triazine) and a reinforcement member 110*a*R such as glass fiber, and functions to improve the rigidity of the circuit board. As the number of terminals of semiconductor devices disposed on recent circuit boards increases, wiring becomes more complex, and accordingly, a thickness of the first and second build-up insulating layers 110*b* and 110*c* tends to increase. Accordingly, the core layer 110*a* of this embodiment may have a thickness of 120 μm to 1200 μm to improve the overall rigidity of the circuit board and prevent excessive signal loss. A via hole may be formed penetrating one side and the other side of the core layer 110*a*. The via hole in the core layer 110*a* can be formed using a mechanical drill process or a $CO_2$ laser. When forming a via hole in the core layer 110*a* using a mechanical drill, a slope of the inner wall of the via hole may be perpendicular to one surface and/or the other surface of the core layer 110*a*. In addition, when forming via holes in the core layer 110*a* using a CO2 laser, an inner wall of the via hole may have a plurality of concave portions and/or convex portions alternately stacked along the vertical direction. Here, the concave portion may refer to a region that is concave in a direction away from the horizontal center of the via hole provided in the core layer 110*a*, and the convex portion may refer to a region that protrudes and/or is convex toward the horizontal center of the via hole provided in the core layer 110*a*. In addition, the concave portions and convex portions may be provided alternately along the vertical direction on the inner walls forming the via holes of the core layer 110*a*. Here, being provided alternately means that a convex portion is provided between a plurality of concave portions, and that a concave portion is provided between a plurality of convex portions. In the case of via holes formed using a mechanical drilling process, a path for transmitting electrical signals is shortened, which may be advantageous for electrical characteristics, but the process cost may increase. Additionally, when using a $CO_2$ laser to form concave and convex portions on the inner wall of the via hole, the thickness of a core via electrode 130-1 provided on the inner wall of the via hole can be increased in a subsequent process, which has the advantage of lowering the impedance and lowering the process cost. Accordingly, a processing method of the via hole provided in the core layer 110*a* can be freely and selectively used depending on the application field of the semiconductor package.

A core via electrode 130-1 may be disposed within the via hole of the core layer 110*a*. The core via electrode 130-1 functions to electrically connect the first build-up layer UB and the second build-up layer LB. Therefore, it is preferable that the core via electrode 130-1 densely fills the via holes for the function of resistance or heat dissipation. However, when the thickness of the core layer 110*a* becomes thick as described above, it may become difficult for the core via electrode 130-1 to densely fill the via hole. For example, if a via hole provided in the thick core layer 110*a* is to be filled by a plating process as described above, voids may occur inside the core via electrode 130-1. The voids expand due to heat generated during the operation of the semiconductor package, which reduces the mechanical reliability of the circuit board. Accordingly, the core via electrode 130-1 having a predetermined thickness is disposed on the inner wall of the via hole of the core layer 110*a*. The thickness of the core via electrode 130-1 does not mean the thickness in the vertical direction, which is the direction in which the first build-up layer UB, the core layer 110*a*, and the second build-up layer LB are stacked. That is, the thickness of the core via electrode 130-1 means a thickness in the horizontal direction perpendicular to the vertical direction. The thickness of the core via electrode 130-1 can be arranged to have a thickness of 5 μm to 20 μm to prevent the voltage drop that occurs as the thickness of the core layer 110*a* increases and to prevent the generation of voids. It is difficult to densely fill the inside of the core via electrode 130-1 with metal through a process such as plating, resulting in an empty space. The empty space may be a problem that makes it difficult to place the first build-up layer UB evenly when stacking the first build-up layer UB.

Accordingly, a filling member 110*a*F can be disposed inside the core via electrode 130-1, thereby ensuring the flatness of the core layer 110*a*. As an example, a filling member 110*a*F may be disposed in the via hole of the core layer 110*a*, and the core via electrode 130-1 surrounds the side of the filling member 110*a*F and may be disposed between the inner wall of the via hole and the outer surface of the filling member 110*a*F.

An upper surface of the filling member 110*a*F may be on the same plane as an upper surface of the core layer 110*a*, or may be disposed closer to the first build-up layer UB along the vertical direction than an upper surface of the core layer 110*a*. A lower surface of the filling member 110*a*F may be on the same plane as a lower surface of the core layer 110*a*, or may be disposed closer to the second build-up layer (LB) along the vertical direction than the lower surface of the core layer 110*a*. This can be freely designed to solve flatness when stacking the first build-up layer UB and the second build-up layer LB.

A first build-up layer UB is disposed on one surface of the core layer 101. The first build-up layer UB includes a plurality of insulating layers 110*b*, a plurality of circuit layers 120-1, a plurality of through electrodes 130-2, a first protective layer 140*a*, an insulating member 160*a*. A second build-up layer LB is disposed on the other surface of the core layer 101. The second build-up layer LB includes a plurality of insulating layers 110*c*, a plurality of circuit layers 120-2, a plurality of through electrodes 130-3 and, a first protective layer 150*a*. The circuit layers 120-1 and 120-2, the through electrodes 130-2 and 130-3, the insulating member 160*a* and protective layer 140*a* and 150*a* of each of the first build-up layer UB and the second build-up layer LB insulating layers 110*b* and 110*c* may correspond to the build-up insulating layer 110, wiring layer 120, through electrode 130, and protective layers 140 and 150 described in the first embodiment, and detailed description thereof is omitted. Hereinafter, the detailed structure of the present application will be described based on the coreless substrate shown in FIGS. 1B and 1C.

The circuit board 10 may provide a space for mounting a semiconductor device. At this time, types of semiconductor devices mounted on the circuit board 10 may vary, and a method of mounting the semiconductor devices on the circuit board 10 may also vary depending on the type of semiconductor device. For example, in the case of a semiconductor device that has relatively large terminals or a low density of terminals, a bonding method using an adhesive member such as general solder paste can be used.

A bonding method using solder paste may include a process of applying an adhesive member, such as solder paste with flux inside, on the pads 121*a*, 121*b*, 121*c* and 121*d*, and a reflow process with the semiconductor device placed on the adhesive member. At this time, when the reflow process proceeds, the flux provided in the adhesive member can flow, the flowing flux may contact other adjacent pads and cause electrical short-circuit problems. Contact with the upper surface of the build-up insulating layer may cause contamination of the surface of the circuit board. Therefore, after the reflow process is performed, a de-flux process to remove the above-mentioned flux can be performed. The de-flux process can be performed by removing the above-mentioned flux by penetrating a solution for de-fluxing into the space between the circuit board and the semiconductor device. At this time, in the de-flux process, the flux may be completely removed or may remain on the build-up structure 100, depending on whether there is enough space for the above-mentioned solution to penetrate.

At this time, a size of a space into which the solution for the de-flux process can penetrate can be determined by a horizontal distance between terminals provided in the semiconductor device and a vertical distance between the semiconductor device and the build-up structure 100. At this time, the vertical distance between the semiconductor device and the build-up structure 100 may be determined by a vertical thickness of the first protective layer 140 disposed on the build-up structure 100.

However, as circuit boards and/or semiconductor packages become lighter, thinner, and shorter, and accordingly, the vertical thickness of the first protective layer 140 is trending to become thinner. Because of this, there is a limit to increasing the vertical distance between the semiconductor device and the build-up structure 100. Furthermore, semiconductor devices using a bonding method other than solder paste can be mounted on the circuit board. For example, in the case of a semiconductor device with terminals with a relatively high density, thermal compression bonding (TC bonding) can be used to reduce an amount of solder used, or a bonding method using an adhesive member equipped with a conductive ball inside can be used. At this time, when using the TC bonding method or the bonding method using an adhesive member equipped with conductive balls, the horizontal width and vertical thickness of the adhesive member increase as the vertical thickness of the first protective layer 140 increases. Because of this, a pitch between the pads 121*a*, 121*b*, 121*c*, and 121*d* may increase. At this time, recently, the functions provided by semiconductor devices have increased, the number of I/O terminals provided in semiconductor devices is also increasing as the performance of semiconductor devices improves. Accordingly, the width and/or pitch of I/O terminals provided in semiconductor devices are becoming smaller. When the size of the adhesive member increases as the vertical thickness of the first protective layer 140 increases, in a process of connecting the I/O terminals of a semiconductor device, an electrical short circuit may occur when multiple coupling members come into contact with each other. For this reason, there is a limit to increasing the vertical distance between the semiconductor device and the build-up structure 100 due to restrictions on the vertical thickness of the first protective layer 140.

Furthermore, a horizontal distance between terminals provided in the semiconductor device may be determined by the number and/or density of terminals provided in the semiconductor device. At this time, the number of terminals provided in the semiconductor device may vary depending on the type of semiconductor device. At this time, the horizontal distance between adjacent terminals may decrease as the number of terminals provided in the semiconductor device increases, which may make it difficult to secure sufficient space for the solution for the de-flux process to penetrate.

Recently, there is a trend to place capacitors adjacent to semiconductor devices to improve power droop characteristics when transmitting power to semiconductor devices. At this time, when a capacitor is disposed as a discrete device such as a chip, there is a problem that an inductance increases. For example, if the capacitor is an MLCC, in order to lower an equivalent inductance, a capacitor of two terminals can be increased to a capacitor of four terminals, and this can lower the inductance and improve the power transfer characteristics delivered to the semiconductor chip.

Referring to FIG. 2A, an existing MLCC may be equipped with two terminals. FIG. 2A (a) is a perspective view showing a two-phase MLCC, and FIG. 2A (b) is a plan view after a two-phase MLCC is mounted on a circuit board. The MLCC includes a device body 200, a first terminal 210 provided on a first surface of the device body 200, and a second terminal 220 provided on a second surface opposite to the first surface of the device body 200. In this case, since the MLCC can have only two terminals 210 and 220, a distance in a horizontal direction between the two terminals 210 and 220 may be larger than when it has a larger number of terminals. Therefore, when the MLCC is mounted on the circuit board 10, flux can be completely removed because sufficient space for the solution to penetrate can be secured corresponding to the distance in the horizontal direction between the two terminals 210 and 220.

Referring to FIG. 2B, the MLCC may be equipped with four terminals. FIG. 2B (a) is a perspective view showing a three-phase MLCC, and FIG. 2B (b) is a plan view after a three-phase MLCC is mounted on a circuit board. The MLCC includes a device body 230, a first terminal 240 provided on a first surface of the device body 230, a second terminal 250 provided on a second surface opposite to the first surface of the device body 230, a third terminal 260 provided on a third surface between the first and second surfaces of the device body 230, and a fourth terminal 270 may be provided on a fourth surface opposite to the third surface of the device body 230. In this case, the MLCC has four terminals 240, 250, 260 and 270, and accordingly, a horizontal distance between the four terminals 240, 250, 260, and 270 may be smaller than a horizontal distance in a case of only two terminals 210 and 220. Therefore, when the MLCC is mounted on the circuit board 10, as the horizontal distance between the four terminals 240, 250, 260, and 270 is relatively small, it may be difficult to secure sufficient space for the solution to penetrate. As a result, a flux is not completely removed, which can cause electrical short-circuit problems or contamination of the surface of the circuit board, or cause voids during subsequent processes such as underfilling or molding. This may reduce the reliability of the semiconductor package.

For this purpose, the embodiment allows the insulating member 160 to be placed in a local region on the first protective layer 140, and allows increasing the distance in the vertical direction between the upper surface of the build-up structure 100 and the lower surface of the semiconductor device using the above-described insulating member 160. Through this, the embodiment ensures sufficient space for the solution for de-flux to penetrate.

That is, the insulating member 160 may function to ensure a vertical separation distance between an upper surface of the build-up structure 100 and a lower surface of the semiconductor device by a predetermined distance or more. The insulating member 160 allows the de-flux solution to easily penetrate into a space between an upper surface of the build-up structure 100 and a lower surface of the semiconductor device, and thereby function to prevent flux from remaining on the build-up structure 100. Additionally, the insulating member 160 may function to allow a molding member to be described later to easily flow into a space between the upper surface of the build-up structure 100 and the lower surface of the semiconductor device. For convenience of explanation, the insulating member 160 is divided into layers different from the first protective layer 140 in FIGS. 1A to 7, and the insulating member 160 is not limited thereto and may refer to a protrusion of the first protective layer 140. For example, the first protective layer 140 and the insulating member 160 may be integrally formed, and accordingly, the insulating member 160 may be a protrusion provided to be spaced apart from each other in the horizontal direction on the upper surface of the first protective layer 140. As another example, the first protective layer 140 and the insulating member 160 may be separate layers. At this time, the first protective layer 140 and the insulating member 160 may be made of a same insulating material, and for example, a solder resist may be used.

At this time, a vertical thickness H1 of the first protective layer 140 may be different from a vertical thickness H2 of the insulating member 160. Preferably, a vertical thickness H1 of the first protective layer 140 may be smaller than a vertical thickness H2 of the insulating member 160.

If a vertical thickness of the first protective layer 140 is greater than a vertical thickness H2 of the insulating member 160, stress due to a heat cycle generated by the first protective layer 140 may increase, and this may cause the circuit board to be greatly bent in a specific direction. In addition, if the vertical thickness of the first protective layer 140 is greater than the vertical thickness H2 of the insulating member 160, a width and a thickness of the adhesive member may increase in a region where the above-described bonding method using micro balls is used, and this may make it difficult to refine the pitch of the pads. In addition, when a thickness H2 of the insulating member 160 is smaller than a thickness H1 of the first protective layer 140, it may be difficult to secure sufficient space for the solution for de-flux to penetrate, and this may cause electrical short-circuit problems and/or surface contamination problems due to residual flux.

For example, a vertical thickness H2 of the insulating member 160 may range from 1.2 to 5 times a vertical thickness H1 of the first protective layer 140. If the vertical thickness H2 of the insulating member 160 is less than 1.2 times a vertical thickness H1 of the first protective layer 140, the effect realized by the arrangement of the insulating member 160 may be minimal, and electrical short-circuit problems and/or surface contamination problems may occur due to residual flux. If the vertical thickness H2 of the insulating member 160 is greater than 5 times the vertical thickness H1 of the first protective layer 140, the vertical distance between the build-up structure and the semiconductor device may increase excessively, and the volume of the adhesive member for mounting the semiconductor device may increase. As a result, due to an increase in the volume of the adhesive member, cracks may occur in the adhesive member even with a small impact, resulting in electrical reliability problems between the semiconductor device and the build-up structure, or an electrical short circuit problem may occur in which a plurality of adjacent adhesive members contact each other due to diffusion of the adhesive member in the horizontal direction.

Additionally, an area of the upper surface of the insulating member 160 may be different from an area of the upper surface of the pads 121*a*, 121*b*, 121*c*, and 121*d*. For example, a plurality of insulating members 160 are provided, and an area of an upper surface of each of the plurality of insulating members 160 may be smaller than the area of the upper surface of the pads 121*a*, 121*b*, 121*c*, and 121*d*. Through this, the embodiment can minimize the region in which the insulating member 160 is placed, minimize the transfer of stress acting on the insulating member 160 to the pads 121*a*, 121*b*, 121*c*, and 121*d* due to the heat cycle, and minimize the occurrence of cracks in coupling members disposed on the pads 121*a*, 121*b*, 121*c*, and 121*d*.

That is, when mounting a semiconductor device using solder on a circuit board, the first protective layer 140 is arranged to have a predetermined thickness to have a predetermined pitch. Furthermore, in order to facilitate penetration of solution for de-flux when mounting an MLCC, the insulating member 160 may be placed thicker than the first protective layer 140 to improve Z-height.

In addition, as described above, the insulating member 160 and the first protective layer 140 are described as being different layers for convenience of explanation. However, the embodiment is not limited to this, and the insulating member 160 may be a protrusion from which the first protective layer 140 protrudes. That is, the insulating member 160 may be made of the same material as the first protective layer 140 to reduce the difference in thermal expansion coefficient from the first protective layer 140 and made of a material different from the first protective layer 140 to facilitate improving the Z-height described above. Specifically, the first protective layer 140 shown in this specification may be made of a solder resist material, and the insulating member 160 may also be made of a solder resist material. In addition, the first protective layer 140 is made of a solder resist material, and the insulating member 160 may be a thermosetting insulating material containing an inorganic filler in a resin, and for example, may be used Ajinomoto's ABF (Ajinomoto Build-up Film). However, the embodiment is not limited to this, and a photo-curable insulating material (Photo Image-able Dielectric, PID) may be used to form a fine pattern. Preferably, in order to reduce the difference in thermal expansion coefficient between the first protective layer 140 and the insulating member 160, the first protective layer 140 and the insulating member 160 are preferably made of the same material, and for example, may be made of solder resist. However, the insulating member 160 may be made of a different material from the first protective layer 140 in order to more stably secure the Z-height.

Hereinafter, an arrangement structure of the pads 121*a*, 121*b*, 121*c*, and 121*d*, the first protective layer 140, and the insulating member 160 of the build-up structure 100 of the embodiment will be described in more detail. At this time, the circuit board of the embodiment may provide a space for mounting a semiconductor device, and, for example, may provide a space for mounting a three-phase MLCC with four terminals. Hereinafter, the arrangement structure of the pads 121*a*, 121*b*, 121*c*, and 121*d* of the build-up structure 100, the first protective layer 140, and the insulating member 160 in the space where the three-phase MLCC is mounted will be described. However, the embodiment is not limited to this, and the structure of the pads 121*a*, 121*b*, 121*c*, 121*d*, the first protective layer 140, and the insulating member 160 of the build-up structure 100, which will be described later, may also be implemented in a space where passive devices and/or active devices other than the MLCC are disposed.

Referring to FIG. 3A, a wiring layer 320 may be disposed on an upper surface of the build-up insulating layer 310. The wiring layer 320 may represent a wiring layer used as pads connected to terminals of a semiconductor device among wiring layers disposed on an upper surface of the build-up insulating layer 310.

The wiring layer 320 may include a first wiring pattern 321, a second wiring pattern 322, and a third wiring pattern 323. The second wiring pattern 322 and the third wiring pattern 323 may be arranged to be spaced apart from each other along the first horizontal direction on an upper surface of the build-up insulating layer 310. Additionally, the first wiring pattern 321 may be provided to surround the second wiring pattern 322 and the third wiring pattern 323 at a position spaced apart from the second wiring pattern 322 and the third wiring pattern 323.

Referring to FIG. 3B, a protective layer 330 may be disposed on the build-up insulating layer 310. The protective layer 330 may have a through hole 331 passing through from the upper surface of the protective layer 330 to the lower surface of the protective layer 330. At least a portion of the through hole 331 may overlap an upper surface of the wiring layer 320 in a vertical direction, and the other portion may overlap along the vertical direction with the upper surface of the build-up insulating layer 310 in the region where the wiring layer 320 is not disposed. In addition, each of the first wiring pattern 321, the second wiring pattern 322, and the third wiring pattern 323 may be provided with a pad that overlaps the through hole 331 of the protective layer 330 and along a vertical direction.

For example, the first wiring pattern 321 may overlap the through hole 331 in a vertical direction at different positions. For example, the first wiring pattern 321 may include a first pad 321-1 overlapping with the through hole 331 along the vertical direction at a first side of the through hole 331. Additionally, the first wiring pattern 321 may include a second pad 321-2 overlapping with the through hole 331 along the vertical direction at a second side of the through hole 331. The first pad 321-1 and the second pad 321-2 are part of the first wiring pattern 321, and accordingly, the first pad 321-1 and the second pad 321-2 may be connected to each other.

Additionally, the second wiring pattern 322 may include a third pad 322-1 overlapping along a direction perpendicular to the through hole 331 at a third side of the through hole 331. Additionally, the third wiring pattern 323 may include a fourth pad 323-1 overlapping with the through hole 331 along the vertical direction at a fourth side of the through hole 331.

That is, a portion of the through hole 331 of the protective layer 330 may overlap the wiring layer 320 along the vertical direction, and a region of the wiring layer 320 overlapping the through hole 331 along the vertical direction can be used as a pad 321-1, 321-2, 322-1 and 323-1 connected to the terminal of a semiconductor device.

Additionally, at least a portion of the through hole 331 of the protective layer 330 may not overlap or be misaligned with the wiring layer 320 in the vertical direction. That is, at least a portion of the upper surface of the build-up insulating layer 310 may overlap in the vertical direction with the through hole of the protective layer 330 without overlapping (or being offset from) the wiring layer 320 in the vertical direction. For example, one through hole 331 provided in the protective layer 330 may expose the upper surface of the build-up insulating layer 310 provided between the pads 321-1, 321-2, 322-1, and 323-1 from the protective layer 330 while exposing the pads 321-1, 321-2, 322-1, and 323-1, respectively. However, the embodiment is not limited to this, and as another example, the through hole of the protective layer 330 may include a plurality of hole parts spaced apart from each other along the horizontal direction, and each of the plurality of hole parts may overlap each of the pads 321-1, 321-2, 322-1, and 323-1 along a vertical direction. Hereinafter, the description will be based on an embodiment in which one through hole 331 overlaps the pads 321-1, 321-2, 322-1, 323-1, and 323-1 in a vertical direction and also overlaps the upper surface of the build-up insulating layer 310 between the pads 321-1, 321-2, 322-1, and 323-1 in a vertical direction.

Exemplarily, a region between the first pad 321-1 and the second pad 321-2 and/or a region between the third pad 322-1 and the fourth pad 323-1 may overlap with the through hole 331 of the protective layer 330 along the vertical direction. Through this, a vertical distance between the circuit board and the semiconductor device in the region between the above-mentioned pads 321-1, 321-2, 322-1, and 323-1 may be a vertical distance between the upper surface of the build-up insulating layer 310 and the upper surface of the semiconductor device. Accordingly, the embodiment may increase the distance in the vertical direction between the circuit board and the semiconductor device in the region between the pads 321-1, 321-2, 322-1, and 323-1, allows the solution for de-flux to more easily penetrate into the above-mentioned region, and allows the flux to be more completely removed. Accordingly, the embodiment can solve electrical reliability problems that may arise as the flux is not completely removed, and furthermore, embodiment can solve surface contamination problems that may occur due to residual flux. Therefore, the embodiment can improve the electrical reliability of the circuit board and enable semiconductor devices placed on a circuit board to be placed more stably. Furthermore, the embodiment can enable semiconductor devices to operate more stably, and products such as servers to which semiconductor packages are applied can operate more stably.

Referring to FIG. 3C, insulating members 341, 342, 343, and 344 may be disposed on the protective layer 330. The insulating members 341, 342, 343 and 344 may protrude at a certain height on the protective layer 330. The insulating members 341, 342, 343, and 344 may be disposed in a region that overlaps the semiconductor device mounted on the circuit board in a vertical direction. For example, the insulating members 341, 342, 343, and 344 may include regions that overlap along a vertical direction with a semiconductor device disposed on a circuit board. The overlapping region increases the vertical distance between the semiconductor device and the pads, thereby ensuring sufficient space for the solution for de-flux to penetrate.

The insulating members 341, 342, 343 and 344 may be disposed around the pads 321-1, 321-2, 322-1 and 323-1. Exemplarily, the first insulating member 341 may be disposed between the first pad 321-1 and the third pad 322-1, the second insulating member 342 may be disposed between the first pad 321-1 and the fourth pad 323-1, the third insulating member 343 may be disposed between the second pad 321-2 and the fourth pad 323-1, and the fourth insulating member 344 may be disposed between the second pad 321-2 and the third pad 322-1. The first to fourth insulating members 341, 342, 343 and 344 are arranged at different positions and spaced apart from each other, and accordingly, the solution for de-flux can easily penetrate into the space between each insulating member. Furthermore, the first to fourth insulating members 341, 342, 343 and 344 are disposed between each pad 321-1, 321-2, 322-1 and 323-1, so that the semiconductor device can be more stably seated on the circuit board 10. For example, if insulating members 341, 342, 343 and 344 are disposed only in a specific region, a problem may occur in which a semiconductor device is mounted at an angle on the circuit board 10, which may deteriorate the electrical and/or mechanical reliability of the circuit board and semiconductor package. Accordingly, the embodiment allows the first to fourth insulating members 341, 342, 343, and 344 to be disposed between the respective pads 321-1, 321-2, 322-1, and 323-1, and accordingly, the semiconductor device disposed on the circuit board 10 can be stably supported, and through this, the flatness of the semiconductor device can be improved so that the semiconductor device can be mounted more stably. Accordingly, the embodiment can enable the semiconductor device to operate more stably.

Additionally, the insulating members 341, 342, 343, and 344 may be disposed around the through hole 331 provided in the protective layer 330. At this time, the insulating members 341, 342, 343, and 344 may not overlap or be misaligned with the through hole 331 provided in the protective layer 330 along the vertical direction. If the insulating members 341, 342, 343, 344 overlap the through hole 331 in the vertical direction, process characteristics in a process of mounting semiconductor devices are deteriorated, or process characteristics in a process of applying the adhesive member may deteriorate by overlapping at least a portion of the pads 321-1, 321-2, 322-1 and 323-1 with the insulating members 341, 342, 343 and 344 along the vertical direction. As a result, an area of the pads 321-1, 321-2, 322-1, and 323-1 may be reduced and the contact resistance between the semiconductor device and the circuit board may increase.

The insulating members 341, 342, 343, and 344 may be provided at positions spaced apart from the inner wall of the through hole 331 of the protective layer 330 at regular intervals along the horizontal direction. For example, the inner wall of the through hole 331 may include a first inner wall 331-1 extending along the first horizontal direction on the build-up insulating layer 310, and the insulating members 341, 342, 343 and 344 may be spaced apart from the first inner wall 331-1 at a first distance W1 along the horizontal direction. Exemplarily, the insulating members 341, 342, 343, and 344 may be spaced apart from the periphery of an upper end of the first inner wall 331-1 at a first distance W1 along the horizontal direction.

In addition, the inner wall of the through hole 331 may include a second inner wall 331-2 extending along the second horizontal direction on the build-up insulating layer 310, and the insulating members 341, 342, 343 and 344 may be spaced apart from the second inner wall 331-2 by a second distance W2 along the horizontal direction. The insulating members 341, 342, 343, and 344 may be spaced apart from the upper periphery of the second inner wall 331-2 by a second distance W2 along the horizontal direction. The first distance W1 and the second distance W2 may be the same or different from each other.

The first distance W1 and the second distance W2 may be greater than the vertical thickness of the protective layer 330. In addition, if the first distance W1 and the second distance W2 are smaller than the vertical thickness of the protective layer 330, at least a portion of the insulating members 341, 342, 343 and 344 may cover the through hole of the protective layer 330 due to process errors in the process of forming the insulating members 341, 342, 343 and 344. As a result, electrical reliability and/or mechanical reliability may be reduced.

The first distance W1 and the second distance W2 may be smaller than the vertical thickness of the insulating members 341, 342, 343, and 344. If the first distance W1 and the second distance W2 are greater than the vertical thickness of the insulating member 341, 342, 343 and 344, an area of the overlapping region in the vertical direction between the insulating member 341, 342, 343 and 344 and the semiconductor device may be reduced, and furthermore, a problem may occur in which at least some of the insulating members 341, 342, 343, and 344 do not overlap the semiconductor device in the vertical direction. In addition, If the first distance W1 and the second distance W2 are greater than the vertical thickness of the insulating members 341, 342, 343 and 344, the semiconductor device may not be stably placed on the circuit board, and mechanical reliability and/or electrical reliability problems may occur as a result.

Referring to FIGS. 4A and 4B, the semiconductor package of the embodiment may include a circuit board and a semiconductor device 440 disposed on the circuit board.

The circuit board may include a build-up structure 400, a first protective layer 410, and a second protective layer 420, and a plurality of insulating members 430 spaced apart from each other may be disposed on the first protective layer 410.

Additionally, the build-up structure 400 may include a build-up insulating layer 401 and a plurality of pads 402, 403, 404, and 405. In addition, the first protective layer 410 is disposed on the build-up insulating layer 401 and may include a through hole 411 that overlaps a plurality of pads 402, 403, 404, and 405 along the vertical direction.

A semiconductor device 440 may be placed on the build-up structure 400. The semiconductor device 440 may include a device body 441 and first to fourth terminals 441, 443, 444, and 445. Each of the first to fourth terminals 441, 443, 444, and 445 may be electrically connected to the pads 402, 403, 404, and 405 and an adhesive member 450.

The semiconductor device 440 may include regions OR1, OR2, OR3 and OR4 that overlap the insulating members 431, 432, 433, and 434 along the vertical direction. Here, the semiconductor device 440 includes active devices such as CPU, Memory, GPU, and FPGA. In addition, the semiconductor device 440 should be interpreted to mean not only those made of semiconductor materials such as silicon (Si), but also capacitors and electronic devices such as MLCC.

Exemplarily, the semiconductor device 440 can include a first overlapping region OR1 that overlaps the first insulating member 431 along the vertical direction, a second overlapping region OR2 overlapping the second insulating member 432 along the vertical direction, a third overlapping region OR3 overlapping the third insulating member 433 along the vertical direction, and a fourth overlapping region OR4 overlapping the fourth insulating member 434 along the vertical direction. Additionally, the first to fourth overlapping regions OR1, OR2, OR3 and OR4 may be located in corner regions of the semiconductor device 440. The first to fourth overlapping regions OR1, OR2, OR3, OR4 are positioned at the corner regions of the semiconductor device 440, so that it is possible to minimize the stress caused by the heat cycle of the insulating members 431, 432, 433 and 434 being transmitted to the semiconductor device 440. Accordingly, the semiconductor device 440 can be placed more stably on the circuit board.

Additionally, a planar area of each of the first to fourth overlapping regions OR1, OR2, OR3 and OR4 may satisfy a range of 2% to 7% of a planar area of the semiconductor device 440. If the planar area of each of the first to fourth overlapping regions OR1, OR2, OR3 and OR4 is less than 2% of the planar area of the semiconductor device 440, the semiconductor device 440 may not be stably supported by the insulating members 431, 432, 433, and 434, and as a result, the semiconductor device 440 may be mounted in an inclined state on the circuit board. If the planar area of each of the first to fourth overlapping regions OR1, OR2, OR3 and OR4 exceeds 7% of the planar area of the semiconductor device 440, the effect of expanding the space of the solution for de-flux may be insignificant, and the resulting improvement in flux removal may be insignificant.

That is, the semiconductor device 440 includes a plurality of terminals, and the plurality of terminals may include an overlapping region overlapping with the insulating members 431, 432, 433 and 434 along the vertical direction, and a non-overlapping region that is misaligned with the insulating member 160 along the vertical direction. Additionally, the overlapping region may include a portion of the lower surface of the first terminal 442 and a portion of the lower surface of the second terminal 443 of the semiconductor device 440. Additionally, the non-overlapping region may include a remaining portion of the lower surface of the first terminal 442 of the semiconductor device, a remaining portion of the lower surface of the second terminal 443, an entire region of the lower surface of the third terminal 444, and an entire region of the lower surface of the fourth terminal 445.

In addition, each of the above-described non-overlapping regions may overlap the pads in a vertical direction and may contact the adhesive member 445. In addition, each of the above-described overlapping regions may be placed in direct contact with the insulating members 431, 432, 433 and 434, or may be spaced apart from the insulating member 431, 432, 433 and 434 along the vertical direction with the adhesive member 445 interposed therebetween.

Referring to FIGS. 4C to 4F, a first pad 402, a second pad 403, a third pad 404, and a fourth pad 405 may be disposed on an upper surface of the build-up insulating layer 401. In addition, a protective layer 410 having a through hole that overlaps the first pad 402, the second pad 403, the third pad 404, and the fourth pad 405 along a vertical direction may be disposed on the upper surface of the build-up insulating layer 401.

An adhesive member 450 may be disposed on the first pad 402, the second pad 403, the third pad 404, and the fourth pad 405. Additionally, a semiconductor device 440 may be disposed on the adhesive member 450. The semiconductor device 440 can include a device body 441, a first terminal 442 connected to the first pad 402, a second terminal 443 connected to the second pad 403, a third terminal 444 connected to the third pad 404, and a fourth terminal 445 connected to the fourth pad 405. At this time, each of the first terminal 442, the second terminal 443, the third terminal 444, and the fourth terminal 445 of the semiconductor device 440 may include a region that vertically overlaps each of the first pad 402, the second pad 403, the third pad 404, and the fourth pad 405, and this region may include regions that are not in contact with the circuit board. Exemplarily, the region of each of the first terminal 442, the second terminal 443, the third terminal 444, and the fourth terminal 445 of the semiconductor device 440 that overlaps the first pad 402, the second pad 403, the third pad 404, and the fourth pad 405 along the vertical direction may be spaced apart from the upper surface of the protective layer 410 of the circuit board by a first vertical distance H2 without contacting the insulating members 431, 432, 433, 434. The first vertical distance H2 may correspond to the thickness of the insulating members 431, 432, 433, and 434 disposed on the protective layer 410. Through this, the embodiment can increase the vertical distance between the semiconductor device 440 and the circuit board by the first vertical distance H2 corresponding to the thickness of the insulating members 431, 432, 433, and 434. Accordingly, it is possible to secure sufficient space for the solution for de-flux to penetrate, thereby improving the problem of voids occurring during subsequent processes such as underfilling and/or molding. Accordingly, the electrical reliability and/or mechanical reliability of the circuit board and semiconductor package can be further improved.

Additionally, the semiconductor device 440 may include regions that overlap the insulating members 431, 432, 433, and 434 along a vertical direction. And, the overlapping regions OR1, OR, OR3 and OR4 of the semiconductor device 440 overlapped with the insulating members 431, 432, 433 and 434 along the vertical direction can be disposed in direct contact with the insulating member 431, 432, 433 and 434. Through this, the semiconductor device 440 can be supported by the insulating members 431, 432, 433, and 434 and seated more stably on the circuit board. However, the embodiment is not limited to this.

Exemplarily, the overlapping regions OR1, OR, OR3 and OR4 of the semiconductor device 440 may be spaced apart from the insulating members 431, 432, 433 and 434 along the vertical direction by adjusting a volume of the adhesive member 450. In this case, an adhesive member 450 may be disposed between the insulating members 431, 432, 433, and 434 and the overlapping regions OR1, OR, OR3 and OR4 of the semiconductor device 440. In this case, the embodiment can further increase an contact area between the adhesive member 450 and the semiconductor device 440, thereby allowing the semiconductor device 440 to be more stably seated on the circuit board.

Referring to FIG. 4*b*, when an MLCC with four terminals is placed on a circuit board, the terminal of MLCC can have a region overlapping with the insulating members 431, 432, 433 and 434 in the vertical direction, and a region non-overlapping with the insulating members 431, 432, 433 and 434 in the vertical direction. Specifically, the first and second terminals 442 and 443 vertically overlap the insulating members 431, 432, 433 and 434, and the third and fourth terminals 444 and 445 do not vertically overlap the insulating members 431, 432, 433 and 434. Therefore, it is possible to facilitate penetration of a solution for de-flux into the space between the third terminal 444 and the first and second terminals 442 and 443 and the space between the fourth terminal 445 and the first and second terminals 442 and 443, and to enable the MLCC to be mounted stably.

Referring to FIG. 5, the semiconductor package according to the second embodiment may include a build-up structure 500, a first semiconductor device 540, and a second semiconductor device 560.

The first semiconductor device 540 and the second semiconductor device 560 may be mounted on the build-up structure 500 using different bonding methods. Exemplarily, the first semiconductor device 540 may be mounted on the build-up structure 500 through a first adhesive member 530 using solder paste. In this case, a first pad part 501 may be provided on the upper surface of the build-up structure 500, and the first adhesive member 530 may be disposed on the first pad part 501. In addition, a protective layer 510 having a through hole overlapping along the vertical direction with the first pad part 501 is disposed on the build-up structure 500, and an insulating member 520 may be disposed around the through hole of the protective layer 510 and/or around the first pad part 501. Accordingly, the first semiconductor device 540 can be mounted on the first pad part 501 while being supported by the insulating member 520 through the first adhesive member 450.

Additionally, the second semiconductor device 560 may be mounted on the build-up structure 500 through a second adhesive member 550 using TC bonding and/or micro balls. In this case, a second pad part 502 may be further provided on the build-up structure 500, and a second adhesive member 560 may be disposed on the second pad part 502.

At this time, the second semiconductor device 560 may not overlap or be misaligned with the insulating member 520 in the vertical direction. For example, the insulating member 520 may not be provided around the region where the second semiconductor device 560 is mounted and/or around the second pad part 502. Accordingly, the embodiment may reduce a size of the second adhesive member 550, and through this, it may be possible to refine the pitch of the second pad part 502.

Additionally, the semiconductor package may further include a molding member 570. The molding member 570 may be provided to surround the first semiconductor device 540 and the second semiconductor device 550.

Referring to FIG. 6, the semiconductor package may include a build-up structure 600. In addition, a first semiconductor device 640, a second semiconductor device 670, and a third semiconductor device 675 can be mounted on the build-up structure 600.

The first semiconductor device 640 may be mounted on the build-up structure 600 using a different bonding method from the second semiconductor device 670 and the third semiconductor device 680. Exemplarily, the first semiconductor device 640 may be mounted on the build-up structure 600 through the first adhesive member 630 using solder paste. In this case, a first pad part 601 may be provided on the upper surface of the build-up structure 600, and the first adhesive member 630 may be disposed on the first pad part 601. In addition, a protective layer 610 having a through hole overlapping along the vertical direction with the first pad part 601 is disposed on the build-up structure 600, and an insulating member 620 may be disposed around the through hole of the protective layer 610 and/or around the first pad part 601. Accordingly, the first semiconductor device 640 can be mounted on the first pad part 601 while being supported by the insulating member 620 through the first adhesive member 650.

Additionally, the second and third semiconductor devices 670 and 675 may be mounted on the build-up structure 600 through a second adhesive member 650 using TC bonding and/or micro balls. In this case, second and third pad parts 602 and 603) may be further provided on the build-up structure 600, and the second adhesive member 560 may be disposed on the second and third pad parts 602 and 603.

At this time, the second and third semiconductor devices 670 and 675 may not overlap or be misaligned with the insulating member 620 in the vertical direction. Exemplarily, The insulating member 620 may not be provided around of a region where the second and third semiconductor devices 670 and 675 are mounted and/or around the second and third pad parts 602 and 603. Accordingly, the embodiment may reduce the size of the second adhesive member 650, and through this, it may be possible to refine the pitch of the second and third pad parts 602 and 603.

Additionally, the circuit board may further include a connection member 680 embedded in the build-up structure 600. Recently, the number of signals that semiconductor devices must process has increased, and accordingly, the size of semiconductor devices is trending to become greater. However, increasing an area of the semiconductor device causes a problem of lowering the yield of the semiconductor device. Therefore, chiplets can be placed on a circuit board by dividing the size or functional portion of the pattern of the semiconductor device, and a connection member 680 that has the function of electrically connecting them can be embedded in the circuit board. However, the connection member 680 is not limited to this and may connect a semiconductor device with a memory or other semiconductor device.

The connection member 680 may be disposed within an insulating layer adjacent to the protective layer 610 in the build-up structure 600. In this case, the signal transmission distance between the second and third semiconductor devices 670 and 675 and the connection member 680 can be reduced, and accordingly, it is advantageous to prevent signal loss. That is, the connection member 680 electrically connects a plurality of semiconductor devices disposed on the circuit board, and accordingly, it can be advantageous to reduce signal transmission loss by reducing the signal transmission distance while adjacent to multiple semiconductor devices.

Additionally, a third coupling member 690 is disposed on the lower surfaces of the second and third pad parts 602 and 603. The third coupling member 690 may be solder, but is not limited thereto. The connection member 680 includes a pad part, and the pad part of the connection member 680 is electrically connected to the second and third pad parts 602 and 603 through the third coupling member 690.

The connection member 680 may function to electrically connect the second and third semiconductor devices 670 and 675. In this case, the connection member 680 may be a bridge die. Exemplarily, the connection member 680 partially overlaps the second and third semiconductor devices 670 and 675, respectively, in a vertical direction. Additionally, the connection member 680 electrically connects some of the terminals of the second and third semiconductor devices 670 and 675 to each other. The connection member 680 may be made of a material such as silicon or a semiconductor device, or may be made of an organic material such as photosensitive resin or thermosetting resin. Chip-let units separated by function and/or pitch, or multiple semiconductor devices with different functions, such as CPU and GPU, GPU and HBM, etc. may be mounted on a circuit board, and the connection member 680 may function to horizontally electrically connect them.

The connection member 680 may be an organic bridge that can smoothly supply power from the lower to the upper and minimize loss of supplied power. At this time, in the case of an inorganic bridge including a silicon substrate, power can be supplied through TSV (Through Silicon Via), but there are problems in that the process cost for TSV processing increases and product yield decreases. Therefore, it is preferable that the connection member 680 of the embodiment is an organic bridge.

According to the embodiment of FIG. 7, the above-described circuit board can be used as an interposer 700 provided between a semiconductor package substrate of the semiconductor package and the semiconductor device.

In other words, as the terminal density of semiconductor devices increases, the wiring becomes more complex and the thickness of the circuit board increases accordingly. However, as the thickness increases, a problem may occur where the yield of the circuit board decreases. Therefore, the circuit board can be divided into the interposer 700 and the semiconductor package board 720. The above-described circuit board can be used not only as a semiconductor package board 720 but also as an interposer 700.

A semiconductor package substrate 720 is disposed on the lower surface of the interposer 700. The semiconductor package substrate 720 can electrically connect the main board of the electronic device and the interposer.

At this time, a fourth coupling member 710 may be disposed between the interposer and the semiconductor package substrate 720, and through this, the interposer and the semiconductor package substrate 720 may be electrically coupled.

On the other hand, when the circuit board having the above-described characteristics of the invention is used in an IT device or home appliance such as a smart phone, a server computer, a TV, and the like, functions such as signal transmission or power supply can be stably performed. For example, when the circuit board having the features of the present invention performs a semiconductor package function, it can function to safely protect the semiconductor chip from external moisture or contaminants, or alternatively, it is possible to solve problems of leakage current, electrical short circuit between terminals, and electrical opening of terminals supplied to the semiconductor chip. In addition, when the function of signal transmission is in charge, it is possible to solve the noise problem. Through this, the circuit board having the above-described characteristics of the invention can maintain the stable function of the IT device or home appliance, so that the entire product and the circuit board to which the present invention is applied can achieve functional unity or technical interlocking with each other.

When the circuit board having the characteristics of the invention described above is used in a transport device such as a vehicle, it is possible to solve the problem of distortion of a signal transmitted to the transport device, or alternatively, the safety of the transport device can be further improved by safely protecting the semiconductor chip that controls the transport device from the outside and solving the problem of leakage current or electrical short between terminals or the electrical opening of the terminal supplied to the semiconductor chip. Accordingly, the transportation device and the circuit board to which the present invention is applied can achieve functional integrity or technical interlocking with each other. Furthermore, when the circuit board having the above-described characteristics of the invention is used in a transportation device such as a vehicle, it is possible to transmit a high-current signal required by the vehicle at a high speed, thereby improving the safety of the transportation device. Furthermore, the circuit board and the semiconductor package including the same can be operated normally even in an unexpected situation occurring in various driving environments of the transportation device, thereby safely protecting the driver.

The characteristics, structures and effects described in the embodiments above are included in at least one embodiment but are not limited to one embodiment. Furthermore, the characteristics, structures, and effects and the like illustrated in each of the embodiments may be combined or modified even with respect to other embodiments by those of ordinary skill in the art to which the embodiments pertain. Thus, it should be construed that contents related to such a combination and such a modification are included in the scope of the embodiment.

The above description has been focused on the embodiment, but it is merely illustrative and does not limit the embodiment. A person skilled in the art to which the embodiment pertains may appreciate that various modifications and applications not illustrated above are possible without departing from the essential features of the embodiment. For example, each component particularly represented in the embodiment may be modified and implemented. In addition, it should be construed that differences related to such changes and applications are included in the scope of the embodiment defined in the appended claims.

The invention claimed is:

1. A circuit board comprising:

a build-up structure including a plurality of insulating layers stacked along a vertical direction;

a solder resist layer disposed on the build-up structure and including a through hole;

a plurality of insulating members disposed on the solder resist layer and spaced apart from each other along a horizontal direction; and an electronic device disposed on the through hole of the solder resist layer and including a plurality of terminals, wherein the build-up structure includes a plurality of pads overlapping the through hole of the solder resist layer along the vertical direction, wherein the electronic device overlaps the plurality of insulating members along the vertical direction, wherein the plurality of pads are electrically connected to the plurality of terminals of the electronic device, respectively, wherein the solder resist layer includes a plurality of overlapping regions overlapping the plurality of insulating members along the vertical direction, and wherein the through hole of the solder resist layer is disposed between the plurality of overlapping regions.

2. The circuit board of claim 1, wherein the electronic device overlaps the plurality of pads along the vertical direction.

3. The circuit board of claim 2, wherein the plurality of terminals include an overlapping terminal that overlaps at least one of the plurality of insulating members in the vertical direction, and a non-overlapping terminal that does not vertically overlap the plurality of insulating members in the vertical direction.

4. The circuit board of claim 3, further comprising:

a conductive adhesive disposed between the electronic device and the plurality of pads, wherein the conductive adhesive overlaps at least one of the plurality of insulating members along the horizontal direction.

5. The circuit board of claim 4, wherein at least a portion of the conductive adhesive extends between the overlapping terminal of the electronic device and the at least one of the plurality of insulating members.

6. The circuit board of claim 4, wherein a lower surface of the overlapping terminal is in direct contact with an upper surface of the at least one of the plurality of insulating members.

7. The circuit board of claim 2, wherein the plurality of insulating members are spaced apart from each other in a peripheral region of the plurality of pads on the solder resist layer.

8. The circuit board of claim 2, wherein each of the plurality of insulating members is misaligned with the through hole of the solder resist layer in the vertical direction.

9. The circuit board of claim 8, wherein each of the plurality of insulating members is spaced apart from the through hole of the solder resist layer by a predetermined distance in the horizontal direction.

10. The circuit board of claim 9, wherein the predetermined distance is greater than a thickness of the solder resist layer in the vertical direction.

11. The circuit board of claim 9, wherein the predetermined distance is smaller than a thickness of each of the plurality of insulating members in the vertical direction.

12. The circuit board of claim 2, wherein an area of an upper surface of at least one pad among the plurality of pads is greater than an area of an upper surface of each of the plurality of insulating members.

13. The circuit board of claim 2, wherein the plurality of insulating members include:

a first insulating member and a second insulating member spaced apart from each other along a first horizontal direction, a third insulating member spaced apart from the first insulating member along a second horizontal direction perpendicular to the first horizontal direction, and a fourth insulating member spaced apart from the second insulating member along the second horizontal direction, and wherein the plurality of pads include a first pad disposed between the first insulating member and the second insulating member and disposed inside the through hole, a second pad disposed between the second insulating member and the third insulating member and disposed inside the through hole, a third pad disposed between the third insulating member and the fourth insulating member and disposed inside the through hole, and a fourth pad disposed between the first insulating member and the fourth insulating member and disposed inside the through hole.

14. The circuit board of claim 2, wherein the plurality of pads include a first pad, a second pad, a third pad, and a fourth pad, wherein the build-up structure includes a connection wiring aligned with the through hole in the vertical direction and connecting the first pad and the second pad, and wherein the connection wiring overlaps at least one of the plurality of insulating members along the vertical direction.

15. The circuit board of claim 14, wherein the connection wiring includes a first connection portion connecting one end of the first pad and one end of the second pad and disposed at an outside of the third pad, and a second connection portion connecting another end of the first pad and another end of the second pad and disposed at an outside of the fourth pad.

16. The circuit board of claim 14, wherein the connection wiring overlaps each of the plurality of insulating members along the vertical direction.

17. The circuit board of claim 1, wherein the plurality of insulating members and the solder resist layer comprise a same material.

18. The circuit board of claim 17, wherein a thickness of each of the plurality of insulating members in the vertical direction is greater than a thickness of the solder resist layer in the vertical direction.

19. A semiconductor package comprising:

a build-up insulating layer including a plurality of insulating layers stacked along a vertical direction;

a wiring layer disposed on an upper surface of the build-up insulating layer;

a solder resist layer disposed on the wiring layer and including a through hole;

a plurality of insulating members disposed on the solder resist layer and spaced apart from each other along a horizontal direction; and an electronic device disposed on the plurality of insulating members and including a plurality of terminals, wherein the wiring layer includes a plurality of pads overlapping the through hole of the solder resist layer along the vertical direction, wherein the electronic device overlaps the plurality of insulating members along the vertical direction, wherein the plurality of pads are electrically connected to the plurality of terminals of the electronic device, respectively, wherein the solder resist layer includes a plurality of overlapping regions overlapping the plurality of insulating members along the vertical direction, and wherein the through hole of the solder resist layer is disposed between the plurality of overlapping regions.

20. The semiconductor package of claim 19, further comprising:

a conductive adhesive disposed between the electronic device and the plurality of pads, wherein the plurality of terminals include an overlapping terminal that overlaps at least one of the plurality of insulating members in the vertical direction and a non-overlapping terminal that does not overlap the plurality of insulating members in the vertical direction, wherein a lower surface of the overlapping terminal is in direct contact with an upper surface of the insulating member, and wherein at least a portion of the conductive adhesive extends between the overlapping terminal of the electronic device and the insulating member.

* * * * *